United States Patent [19]

Wakamoto et al.

[11] Patent Number: 5,461,237
[45] Date of Patent: Oct. 24, 1995

[54] SURFACE-POSITION SETTING APPARATUS

[75] Inventors: Shinji Wakamoto, Tokyo; Yuji Imai, Ohmiya; Yasuaki Tanaka, Chigasaki, all of Japan

[73] Assignee: Nikon Corporation, Tokyo, Japan

[21] Appl. No.: 280,535

[22] Filed: Jul. 26, 1994

Related U.S. Application Data

[63] Continuation-in-part of Ser. No. 218,842, Mar. 28, 1994, abandoned, which is a continuation of Ser. No. 37,403, Mar. 26, 1993, abandoned.

[30] Foreign Application Priority Data

Jul. 26, 1993 [JP] Japan .................. 5-183898

[51] Int. Cl.⁶ ........................... G01N 21/86
[52] U.S. Cl. ........................... 250/548; 356/401
[58] Field of Search .................. 250/561, 548, 250/557; 356/400, 401; 355/53, 77

[56] References Cited

U.S. PATENT DOCUMENTS

| | | |
|---|---|---|
| 4,558,949 | 12/1985 | Uehara et al. . |
| 4,629,313 | 12/1986 | Tanimoto . |
| 4,650,983 | 3/1987 | Suwa . |
| 4,770,531 | 9/1988 | Tanaka et al. . |
| 4,833,621 | 3/1989 | Umatate . |
| 4,902,900 | 2/1990 | Kamiya et al. ............ 356/400 |
| 4,908,656 | 3/1990 | Suwa et al. . |
| 4,952,815 | 8/1990 | Nishi . |
| 5,118,957 | 6/1992 | Kawashima et al. . |
| 5,191,200 | 3/1993 | Van der Here et al. ............ 250/548 |
| 5,204,535 | 4/1993 | Mizutani . |

*Primary Examiner*—Edward P. Westin
*Assistant Examiner*—Jacqueline M. Steady
*Attorney, Agent, or Firm*—Shapiro and Shapiro

[57] ABSTRACT

In an apparatus which positions an average plane thereof parallel to a best focus plane of a projection optical system even if there is unevenness on a wafer, a leveling stage is tilted on the basis of detection signal from an auto-leveling system and a surface of a shot area on a wafer is positioned in a predetermined tilt position relative to a focus plane of the projection optical system. While such a position being kept unchanged, a deviation between the focus plane of the projection optical system and the surface of the shot area is detected at each of multi-points. Within the shot area, by the use of auto-focus system, an amount of relative tilt between an average plane of the shot area obtained from plural deviations and the focus plane of the projection optical system is calculated, and by the use of thus calculated amount of tilt and the detection signal of auto-leveling system, the focus plane of the projection optical system is positioned in parallel with the average plane of the shot area.

15 Claims, 16 Drawing Sheets

SURFACE-POSITION SETTING APPARATUS

This is a continuation-in-part of application Ser. No. 08/218,842 filed Mar. 28, 1994 (abandoned), which is a continuation of application Ser. No. 08/037,403 filed Mar. 26, 1993 (abandoned).

BACKGROUND OF THE INVENTION

1. Field of the Invention

The present invention relates to an apparatus for positioning a surface of a substrate such as mask, reticle, wafer or glass plate used in a process for manufacturing a semiconductor device or a liquid crystal display device, relative to a predetermined plane.

2. Related Background Art

A surface positioning apparatus of this type has been widely used in proximity gap setting, focusing and leveling, and in many cases, it is built in an apparatus for transferring a pattern on a mask or reticle to a predetermined area on a wafer or plate which is a photo-sensitive substrate, or a so-called exposure apparatus. In a projection exposure apparatus (stepper) which reduces a pattern of a reticle through a projection optical system and sequentially transfers it onto a wafer, a depth of focus of the projection optical system is becoming very small as the miniturization of a circuit pattern progresses. Thus, a displacement of a wafer surface from a virtual reference plane (which substantially coincides with a focusing plane of a projection optical system) along an optical axis of the projection optical system is detected by using an auto-focusing system (AF system) disclosed in U.S. Pat. No. 4,558,949. Then, so-called focusing to finely drive the wafer along the optical axis of the projection optical system in accordance with the deviation of the wafer surface with respect to the reference plane is carried out. In the AF system, a slit pattern image is obliquely projected to a predetermined point in a shot area on the wafer without using the projection optical system, and a reflected image thereof is photo-electrically detected by a synchronous detection method. It is commonly referred to as a fixed point AF system.

In the fixed point AF system, a deviation between the focusing plane and the wafer surface is not directly detected. Thus, if the virtual reference plane described above shifts from the focusing plane of the projection optical system by a drift or the focusing plane shifts by a change in a focusing characteristic of the projection optical system due to the absorption of the exposure light, the shift appears as a residual focus offset when the pattern is projection-exposed to the wafer a method for reducing the residual focus offset is disclosed in U.S. Pat. Nos. 4,650,983, 4,629,313 and 4,952,815.

In the U.S. Pat. No. 4,650,983, a reference pattern is formed on a stage (holder) on which a wafer is mounted, and the reference pattern is reverse-projected to a particular pattern of a reticle through the projection optical system. A level of the stage is adjusted such that a contrast of an image of the reference pattern formed on the particular pattern is maximized. Then, the AF system is calibrated such that the plane on which the reference pattern is formed is detected as best focus plane. In the U.S. Pat. No. 4,629,313, the reference pattern on the stage is a slit-like photo-sensor, and a contrast of a pattern image formed when the slit pattern on the reticle is projected by the projection optical system is detected to identify the best focus plane. In the U.S. Pat. No. 4,952,815, a slit-like light emitting mark is provided on the stage, and an image of the light emitting mark is reverse-projected to a particular mark on the reticle. The stage is driven in X and Y directions and a light transmitted upward from the reticle when the particular mark is scanned by the light emitting mark is photo-electrically detected to detect the best focus plane.

An auto-focusing mechanism including a fixed point AF system and a Z-stage which finely drive a wafer along an optical axis of a projection optical system, and a leveling mechanism for keeping a focusing plane of the projection optical system in parallel to the wafer surface are built in the projection exposure apparatus as a surface positioning apparatus. The leveling mechanism comprises an auto-leveling system (AL system) for detecting an inclination of the wafer surface with respect to the focusing plane of the projection optical system as disclosed in U.S. Pat. No. 4,558,949 and a leveling stage for tilting the wafer in a desired direction.

FIG. 11A shows a main portion of a prior art projection exposure apparatus having a leveling apparatus. In FIG. 11A, a reticle 1 is mounted on a reticle holder 2. An exposure light L1 transmitted through the reticle 1 is directed to a projection optical system 3 which transfers an image of a pattern of the reticle 1 to one shot area on a wafer 4, which is held by a wafer holder (0 table) 5 which is mounted on a leveling stage 6 through three support points. As shown in FIG. 11C, two support points 5a and 5b of the three support points 5a–5c are vertically movable drive points and the remaining one support point 5c is a fixed point. The tilt of the wafer holder 5 may be set as desired by independently adjusting the drive distances of the drive points 5a and 5b by the leveling stage 6.

The leveling stage 6 is mounted on a wafer stage 7 which comprises an XY-stage which is two-dimensionally movable in a plane normal to an optical axis AX of the projection optical system 3, and a Z-stage which is finely movable along the optical axis (Z axis) of the projection optical system 3. The stage unit described above is disclosed, for example, in U.S. Pat. No. 4,770,531. A two-dimensional position (for example, XY coordinates) of the wafer stage 7 is continuously detected by a laser interferometer 8, and the X, Y, Z positioning of the wafer stage 7 and the tilting of the leveling stage 6 are carried out by a drive system 9.

An oblique projection type auto-leveling (AL) system disclosed in U.S. Pat. No. 4,558,949 is provided in FIG. 11A. A detection light L2 from a light source 10 is collimated by an projection objective lens 11, and the collimated light beam is obliquely directed to the wafer 4 with respect to the optical axis AX of the projection optical system 3, to illuminate a substantially entire surface of the shot area. A light reflected by the wafer 4 (collimated light beam) is focused by a focusing objective lens 12 onto a photo-sensing plane of a photo-sensor 13. In the AL system, when the tilt of the wafer 4 changes, a focusing position (center of gravity of light intensity distribution) on the photo-sensing plane of the photo-sensor 13 also changes (shifts). Accordingly, the tilt of the wafer 4 can be detected. As shown in FIG. 11B, the photo-sensor 13 may be a 4-split photo-sensing element.

As shown in FIG. 11C, the photo-sensor 13 is positioned such that the light reflected by a detection area (which corresponds to a shot area) on the wafer 4 is focused to a center of the photo-sensing plane of the photo-sensor 13 when the surface of the wafer 4 (or the reference plate) having a high planarity is parallel to the best focus plane of the projection optical system 3. Thereafter, the tilt of the wafer 4 is adjusted by the leveling stage 6 such that-the reflected light is focused to the center of the photo-sensing plane of the photo-sensor 13 to keep the parallelism between the focus plane of the projection optical system 3 and the surface of the shot area.

While not shown in FIG. 11A, an oblique incidence type auto-focusing system (fixed point AF system) is provided in the projection exposure apparatus. Accordingly, the surface of the wafer 4 (more exactly, a projection point of a slit pattern image) is positioned at substantially same level as the focus plane by driving the wafer stage 7 (Z-stage) in accordance with the detection signal from the fixed point AF system.

When the planarity of the shot areas on the wafer 4 is high, the surface thereof may be set parallel to the focus plane of the projection optical system 3 by the leveling mechanism. However, when the wafer runs through various processes or a plurality of circuit patterns are formed in one shot area, unevenness having a large level difference may be created in the shot area. Due to such unevenness or ununiformity in applying the photoresist, a center of gravity of a light intensity distribution of the reflected light on the photo-sensor (4-split photo-sensing device) 13 may not represent the tilt of the surface of the shot area in the AL system. Namely, even if the leveling mechanism is operated, it may not be possible to set the surface of each shot area parallel to the focus plane of the projection optical system 3.

FIG. 12A shows sawtooth unevenness formed on the wafer 4A. As shown in FIG. 12A, when a detection light L2 is directed to one shot area SA on the wafer 4A, an average plane of the surface of the shot area (for example, a virtual plane defined at a substantially center of a recess and a projection in the shot area) is not kept parallel to the best focus plane P1 of the projection optical system 3 even if the wafer holder 5 is inclined in accordance with the detection signal from the photo-sensor 13. In actual, it is desirable that the average plane of the shot area coincides with the best focus plane P1 as shown in FIG. 12B.

Further, depending on the process (layer), the tilt of the surface of the wafer 4 relative to the focusing plane of the projection optical system 3 when the leveling mechanism is operated may differ from position to position of the wafer 4, that is, from shot area to shot area, as shown in FIGS. 13A and 13B. FIG. 13A shows one shot line seven shot areas) $SA_{11}$–$SA_{17}$. FIG. 13B shows tilts after the leveling of surfaces (average planes) $P_{11}$–$P_{17}$ of the seven shot areas $SA_{11}$–$SA_{17}$ relative to a run plane (drive plane) P2 of the wafer stage. In such a case, it is not possible to make the surface of each shot area coincide to the focusing plane even if a uniform offset is applied after the leveling.

A method for attaining good focusing over the entire shot area, even if the shot area includes unevenness, has recently been developed and is disclosed in U.S. Pat. No. 5,118,957. In this patent, a pinhole image is obliquely projected to each of a plurality of points (for example, five points) in the shot area without using the projection optical system and the reflected images are collectively sensed by a two-dimensional position detection device (CCD). This method is commonly referred to as an oblique incidence type multipoint AF system and it carries out the focus detection and the tilt detection with a high precision. However, in the multipoint AF system, a shift of the surface of the shot area relative to a virtual reference plane (the focusing plane of the projection optical system) is detected at each of the multiple points for each shot area. Then, the average plane of the shot area is determined based on the shifts at the respective points by a minimum square method or an averaging process to calculate the amount of defocus and the tilt relative to the focusing plane of the average plane. Accordingly, a process time for one wafer significantly increases and a throughput decreases.

SUMMARY OF THE INVENTION

It is an object of the present invention to provide a surface positioning apparatus which positions an average plane thereof parallel to a reference plane (a best focus plane of a projection optical system) even if the substrate plane includes unevenness on the surface thereof.

A first surface positioning apparatus of the present invention comprises: first detection means (AF system) for projecting a light beam to a predetermined measurement point in a predetermined area on a substrate and sensing a light beam reflected by said substrate to produce a first signal representing a deviation of a surface of the predetermined area from a predetermined reference plane (for example, a focusing plane of a projection optical system); second detection means (AL system) for obliquely projecting a light beam to a substantially entire surface of the predetermined area and sensing a light beam reflected by the substrate to produce a second signal representing a tilt of the surface of the predetermined area relative to the reference plane; means for setting the surface of the predetermined area to a predetermined tilt position relative to the reference plane in accordance with the second signal; means for calculating a tilt of the surface of the predetermined area relative to the reference plane in accordance with said first signal produced by the first detection means at each of a plurality of predetermined measurement points in the predetermined area set in the predetermined tilt position; and means for correcting the tilt of the surface of the predetermined area set by the setting means in accordance with the calculated tilt.

A second surface positioning apparatus of the present invention comprises: first detection means (AF system) for projecting a light, beam to a predetermined measurement point in a shot area on a substrate and sensing a light beam reflected by said substrate to produce a first signal representing a deviation of a surface of the shot area from a predetermined reference plane; second detection means (AL system) for obliquely projecting a light beam to a substantially entire surface of the shot area and sensing a light beam reflected by the substrate to produce a second signal representing a tilt of the surface of the shot area relative to the reference plane; means for setting the surface of the shot area to a predetermined tilt position relative to the reference plane in accordance with the second signal; means for calculating a tilt of the surface of a specified shot area on the substrate relative to the reference plane in accordance with the first signal produced by the first detection means at each of a plurality of predetermined measurement points in the specified shot area set in the predetermined tilt position; at least three ($SA_1$–$SA_9$) of a plurality of shot areas arranged on the substrate being selected as the specified areas; and means for statistically processing the tilts calculated for the at least three specified shot areas to calculate residual tilt at each of all shot areas on the substrate and correcting the tilts of the surfaces of the shot areas set by the setting means in accordance with the calculated residual tilt.

In accordance with the present invention, when the substrate plane is set to a predetermined tilt position (for example, parallel) relative to the reference plane (for example, the focusing plane of the projection optical system) in accordance with the tilt (second signal) of the substrate plane detected by the second detection means (AL system), the tilt of the substrate plane is corrected in accordance with the residual tilt determined by the first detection means (AF system). Thus, even if there is unevenness in the substrate plane, the average plane of the surface (for example, a virtual plane defined at substantially center between a recess and a projection) can be accurately set parallel to the reference plane. In the second surface positioning apparatus of the present invention, the residual tilts at the at least three specified shot areas of the plurality of shot areas on the substrate are statistically processed to determine the residual tilt for each shot area on the substrate. Accordingly, even if the unevenness differs from shot area to shot area on the substrate, the average plane of the shot area can be accurately set parallel to the reference plane for each shot area with a minimum reduction of a throughput. A principle of the present invention is now explained with reference to FIGS. 1A–1F.

In FIGS. 1A–1F, a substrate (wafer) 4B having a high planarity or a substrate (wafer) 4C to be processed is mounted on a leveling stage 6 through a wafer holder 5, and a shot area on the substrate is leveled relative to a predetermined reference plane, that is, a best focus plane P1 of a projection optical system 3. The leveling stage 6 is driven along a plane P2 by an XY stage (which corresponds to the wafer stage 7 of FIG. 11A) not shown. The plane P2 represents a run plane of the XY stage (which is a drive plane containing an orthogonal coordinate system XY defined by a laser interferometer) and it is not parallel to the best focus plane P1. For a sake of simplification, it is assumed that the plane P2 is parallel to a plane of the drawing, and the best focus plane P1 is inclined relative to the plane P2.

As shown in FIG. 1A, the wafer 4B having a high planarity is mounted on the wafer holder 5, and a detection light (collimated light) L2 of an auto-leveling system (AL system 10–13 in FIG. 11A) is irradiated to the wafer 4B obliquely to an optical axis of the projection optical system 3. The AL system produces a detection signal representing the tilt of the wafer surface relative to the best focus plane P1 and drives the leveling stage 6 in accordance with the detection signal. Since the wafer 4B has a high planarity, the AL system can accurately detect the tilt of the wafer surface. Accordingly, the surface of the wafer 4B can be set accurately parallel to the best focus plane P1 by driving the leveling stage 6 by using the detection signal from the AL system.

Then, the XY stage is driven while the surface of the wafer 4B is kept parallel to the best focus plane P1 to drive the leveling stage 6 to the left on the drawing as shown in FIG. 1B. The leveling stage 6 is driven along the run plane P2 of the XY stage. The detection light (focusing light beam) L3 of the oblique incidence type auto-focusing system is irradiated to the wafer 4B obliquely to the optical axis of the projection optical system 3. It is assumed that the autofocusing system is fixed point AF system which projects an image of a slit pattern to only a predetermined measurement point (for example, a point crossing the optical axis of the projection optical system 3). The fixed point AF system refocuses a reflected light from the wafer 4B to a predetermined plane and detects a level of the surface of the wafer 4B at the measurement point based on a change in the focusing position of the pattern image. In actual, it produces a detection signal representing a deviation $\delta_{10}$ along the optical axis of the projection optical system between the wafer surface and the best focus plane P1 at the measurement point.

Then, the XY stage is driven while it is kept in the state of FIG. 1B to drive the leveling stage 6 to the right on the drawing along the plane P2 as shown in FIG. 1C. Like in FIG. 1B, a deviation $\delta_{20}$ between the surface of the wafer 4B and the best focus plane P1 at a measurement point different from that of FIG. 1B is determined by using the fixed point AF system. Then, the XY stage is driven to drive the leveling stage 6 along the plane P2 and the detection light L3 is irradiated to a measurement point in a shot area different from those of FIGS. 1B and 1C, and a deviation $\delta_{10}$ between the surface of the wafer 4B and the best focus plane P1 at the measurement point is determined. A plurality of measurement points, that is, at least three points which are not on one straight line on the wafer 4B are required, and all measurement points may be set in one shot area (circuit pattern formation area) on the wafer. The plane defined by those deviations $\delta_{j0}$ represents the surface of the wafer 4B, that is, the best focus plane P1. Accordingly, the tilt of the best focus plane P1 relative to the run plane P2 of the XY stage is determined by detecting the level (deviation $\delta_{j0}$) at each of the measurement points on the wafer 4B having a high planarity by using the fixed point AF system.

Then, a process wafer 4C having unevenness on the surface thereof is mounted on the leveling stage 6 as shown in FIG. 1D. The detection light (collimated light beam) L2 from the AL system is irradiated to a substantially entire plane of one shot area on the wafer 4C, and the leveling stage 6 is tilted in accordance with the detection signal from the AL system such that the surface of the shot area is parallel to the best focus plane P1. In actual, however, due to the unevenness in the shot area and the nonuniformity of application of photoresist, the surface of the wafer 4C, that is, the average plane P3 with the consideration of the unevenness is not set parallel to the best focus plane P1.

In the present invention, the tilt of the average plane P3 of the wafer 4C (shot area) (that is) a residual tilt error) relative to the best focus plane P1 in FIG. 1D is determined as the offset of the AL system or more exactly as the offset of the leveling mechanism comprising the AL system and the leveling stage 6. In the present invention, after the wafer 4C is leveled by using the AL system, the XY stage is driven while the wafer 4C is kept tilted as shown in FIG. 1D to drive the leveling stage 6 to the left on the drawing along the plane P2 as shown in FIG. 1E. Then, like in FIG. 1B, the level of a predetermined measurement point in the shot area on the process wafer 4C, that is, a deviation $\delta_{11}$ along the optical axis of the projection optical system 3 between the surface of the wafer 4C and the best focus plane P1 is determined.

Then, only the XY stage is driven while it is kept in the state of FIG. 1E to drive the leveling stage 6 to the right on the drawing along the plane P2 as shown in FIG. 1F. Like in FIG. 1E, a deviation $\delta_{21}$ between the surface of the wafer 4C and the best focus plane P1 at a measurement point in the shot area different from that of FIG. 1E is determined. Then, the XY stage is driven to drive the leveling stage 6 along the plane P2 and the detection light L3 is irradiated to a measurement point in the shot area different from those of FIG. 1E and FIG. 1F, and a deviation $\delta_{j1}$ between the surface of the wafer 4C and the best focus plane P1 at the measurement point is determined. At least three measurement points which are not on one straight line are set in one shot area on the process wafer 4C as they are in the previous case.

The average plane P3 of the shot area defined by the deviations $\delta_{j1}$ is calculated by the minimum square method, for example, and the tilt of the best focus plane P1 relative to the calculated average plane P3 is determined. Since a plurality of deviations $\delta_{j1}$ are detected by driving the leveling stage 6 along the plane P2, the relative tilt between the average plane P3 and the best focus plane P1 includes a relative tilt between the run plane P2 of the XY stage and the best focus plane P1. Thus, the tilt of the best focus plane P1 relative to the run plane P2 of the XY stage determined for the wafer 4B is subtracted from the tilt of the best focus plane P1 relative to the average plane P3 determined for the wafer 4C to accurately determine only the residual tilt of the average plane P3 relative to the best focus plane P1.

Accordingly, in the present invention, the tilt of the wafer set by the leveling mechanism is corrected in accordance with the previously determined tilt. In one example, the above residual tilt is imparted as an offset to the tilt correction amount for the wafer determined by the detection signal from the AL system, and the leveling stage is driven in accordance with the tilt correction amount having the offset imparted thereto. Accordingly, even if there is unevenness on the wafer surface, the average plane P3 of the shot area can be accurately set parallel to the best focus plane P1 of the projection optical system 3.

In the above description, since it was assumed that the best focus plane P1 and the run plane P2 of the XY stage tilt relative to each other, the tilt of the best focus plane P1 relative to the plane P2 is determined by using the wafer having a high planarity. However, where the best focus plane P1 and the plane P2 are parallel or a relative tilt therebetween is less than a predetermined permissible amount, the tilt of the best focus plane P1 relative to the average plane P3 may be determined by using the process wafer and the tilt may be used as the offset (residual tilt) of the leveling mechanism as it is.

Depending on the process wafer, the relative tilt between the average plane P3 and the focusing plane P1 may differ from shot area to shot area. Thus, at least three shot areas which are not on one straight line are selected from the shot areas on the process wafer, and the residual tilt (offset of the leveling mechanism) is determined for each specified shot area in the same manner as that described above.

The residual shift for each specified shot area may be defined by X and Y components. Accordingly, statistic process is performed by using the residual tilts (X and Y components of the specified shot areas and the positions of the specified shot areas in the wafer (coordinates on the orthogonal coordinate system which defines the drive position of the wafer) to determine a function between the residual tilt ($\theta x$, $\theta y$) and the coordinate of the shot area (x, y). For example, a model function ($\theta x=ax+by+c$, $\theta y=dx+ey+f$) conceived for the residual tilt are prepared, and the coefficients (a–f) of the model function are determined by using the minimum square method.

The residual tilt is calculated for each shot area on the wafer by using the model function thus determined. When the leveling is to be made for each shot area on the wafer, the tilt of the shot area which is set by the leveling mechanism is corrected in accordance with the previously determined residual tilt. For example, the above residual tilt is imparted to the tilt correction amount of the wafer representing the detection signal from the AL system, as the offset, and the leveling stage is driven in accordance with the tilt correction amount having the offset imparted thereto. As a result, the average plane P3 of the shot area on the wafer can be set accurately parallel to the best focus plane P1 of the projection optical system 3 for each shot area. Further, since the residual tilts are determined only for at least three specified shot areas on the wafer, the reduction of the throughput of the apparatus is minimized. For a plurality of wafers accommodated in one lot, the residual tilt may be calculated for each shot area by the above statistic process only for the heading (first) wafer, and the residual tilt determined for the first wafer may be used for the second and subsequent wafers as it is.

DETAILED DESCRIPTION OF THE PREFERRED EMBODIMENTS

Figure 1A:
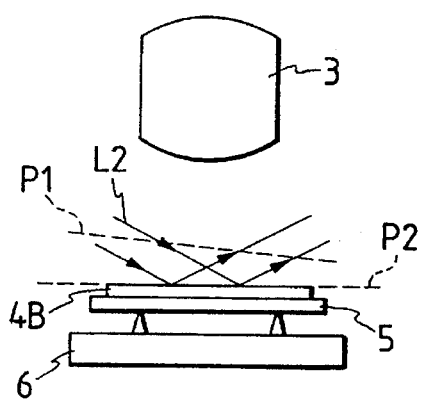
FIGS. 1A to 1F illustrate a principle of leveling operation in the present invention.
Figure 1B:
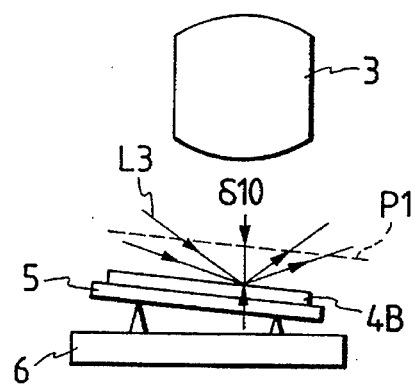
Figure 1C:
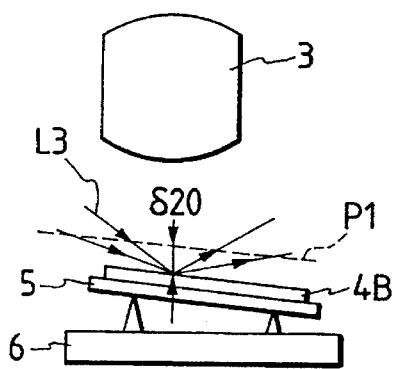
Figure 1D:
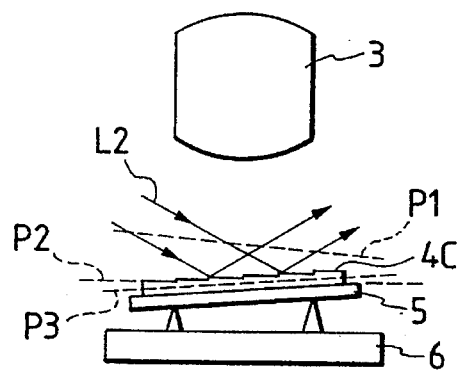
Figure 1E:
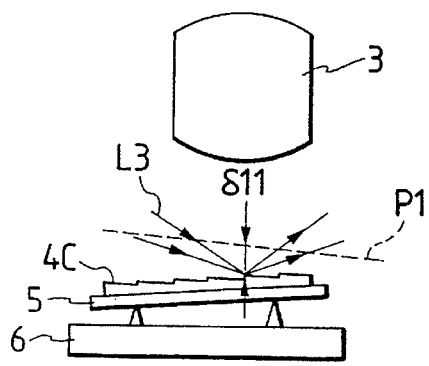
Figure 1F:
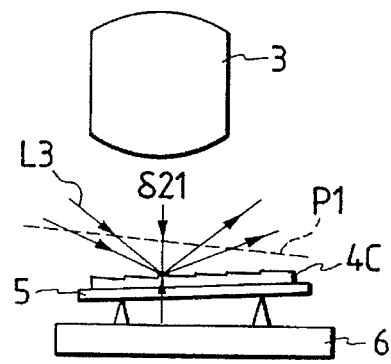
Figure 2:
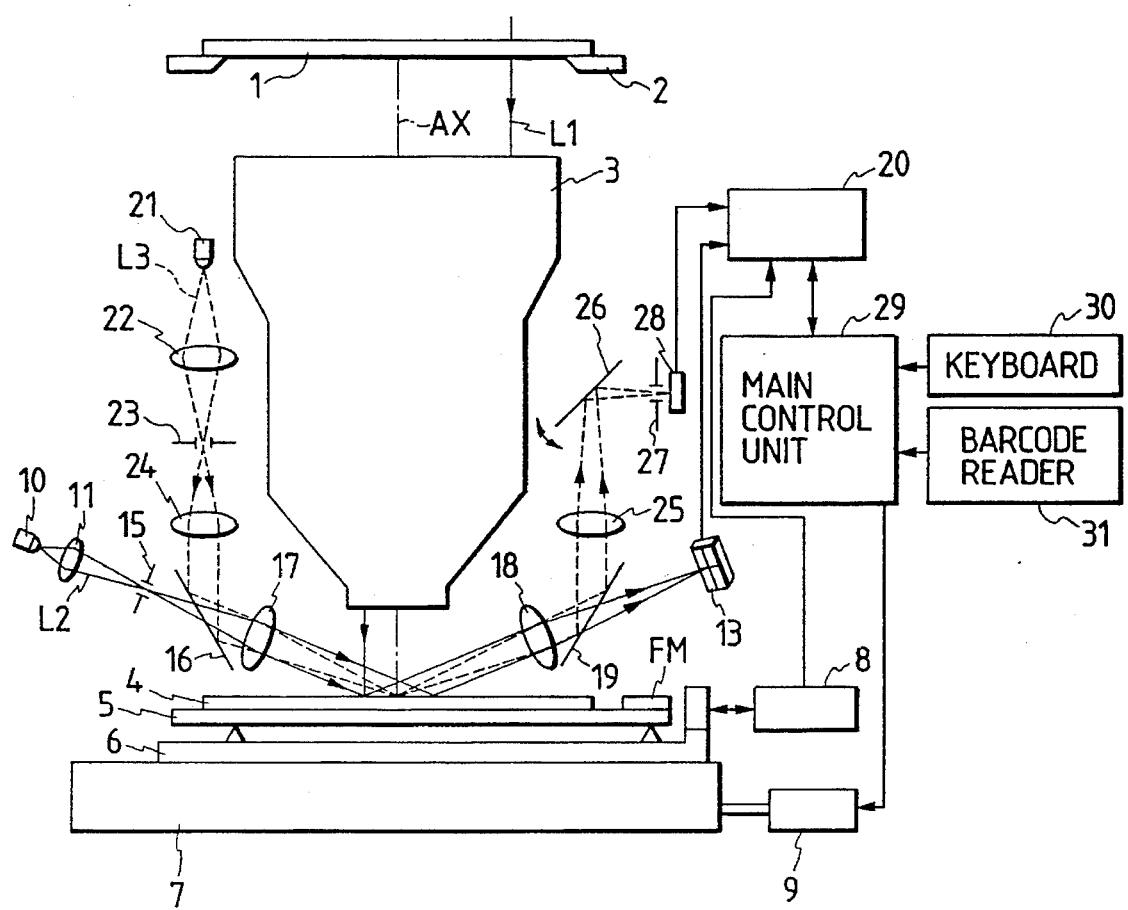
FIG. 2 shows a schematic construction of an exposure apparatus in an embodiment of the present invention.

A first embodiment of the present invention is explained with reference to FIGS. 2 to 6. In the present embodiment, the present invention is applied to a projection exposure apparatus. In FIG. 2, the like elements to those of FIG. 7 are designated by the like numerals and detailed description thereof is omitted. An oblique incidence type AF system and an AL system shown in FIG. 2 are disclosed in U.S. Pat. No. 4,558,949.

FIG. 2 shows a main part of the projection exposure apparatus of the present embodiment. In FIG. 2, an image of a pattern of a reticle 1 is transferred to a predetermined shot area on a wafer 4 through a projection optical system 3. The wafer 4 is held by a wafer holder 5 which is mounted on a leveling stage 6 which in turn is mounted on a wafer stage 7.

A detection light L2 from a light source 10 of the AL system is focused to a pinhole formed in an aperture plate 15 by a condenser lens 11. A detection light L2 transmitted through the pinhole is directed to a second projection objective lens 17 through a beam splitter 16, is collimated and is irradiated to a substantially entire area of one shot area on the wafer 4. A reflected light from the wafer 4 passes through a first focusing objective lens 18 and a beam splitter 19 and is focused onto a photo-sensing plane of a photo-sensor 13. The photo-sensor 13 may be one which detects two-dimensional coordinates of a center of gravity of a light intensity distribution on the photo-sensing plane, for example, a 4-split photo-sensing device. A detection signal (second signal) from the photo-sensor 13 is supplied to a signal processing circuit 20. In this manner, the tilt of the surface of the wafer 4 relative to a predetermined reference plane (which substantially coincides with a best focus plane of the projection optical system 3).

On the other hand, a detection light L3 from a light source 21 of the AF system is irradiated to a slit-shaped aperture pattern (slit pattern) on a slit plate 23 by a condenser lens 22. The detection light L3 transmitted through the slit pattern passes through a first projection objective lens 24, is reflected by a beam splitter 16 and is directed to a predetermined measurement point on the wafer 4 (a predetermined point in a projection view field of the projection optical system 3, for example, an optical axis position) by the second projection objective lens 17. Namely, an image of the slit pattern of the slit plate 23 is projected and focused to the measurement point on the wafer 4. A reflection light from the wafer 4 passes through the first focusing objective lens 18, is reflected by a dychroic mirror 19, passes through a second focusing objective lens 25 and a vibration mirror 26 and is focused onto a photo-sensing slit plate 27 so that the slit pattern image is refocused on the photo-sensing slit plate 27. A photo-sensing device 28 is arranged on the back of the photo-sensing slit plate 27 and a detection signal from the photo-sensing device 28 is supplied to the signal processing circuit 20.

When the wafer 4 is driven along the optical axis AX of the projection optical system 3, the position of the slit pattern image on the wafer 4 is shifted to the left or the right on the drawing so that the position of the slit pattern image on the photo-sensing slit plate 27 is also shifted parallelly to the photo-sensing slit plate 27 (vertically on the drawing). The slit pattern image is vibrated at a predetermined period with a predetermined amplitude by the vibration mirror 26. It uses a principle of detection of a photo-electric microscope and the signal processing circuit 20 synchronously detects the detection signal from the photo-sensing device 28 by the drive signal of the vibration mirror 26. In this manner, a so-called S-shaped position detection signal (first signal) which crosses zero when the surface of the wafer 4 (the measurement point in the shot area) coincides with the reference plane. Accordingly, a deviation δ along the optical axis between the surface of the wafer 4 and the reference plane (the best focus plane of the projection optical system 3) at the predetermined measurement point can be determined based on the position detection signal.

The signal processing circuit 20 supplies the information on the tilt of the surface of the wafer 4 relative to the reference plane and the deviation δ along the optical axis to a main control unit 29, which drives the leveling stage 6 and the wafer stage 7 by a drive unit 9 to conduct the leveling and the focusing. Namely, it tilts the leveling stage 6 to set the surface of the wafer 4 parallel to the best focus plane (reference plane), of the projection optical system 3 and finely drives the wafer stage 7 along the optical axis to make the surface of the wafer 4 coincide with the best focus plane of the projection optical system 3. In this manner, the entire surface of one shot area on the wafer 4 is set within a depth of focus of the projection optical system 3. FIG. 2 further includes a keyboard 30 for enabling an operator to enter various information into the main control unit 29 and a bar code reader 31 for reading a bar code born on the wafer or a wafer cassette.

A leveling operation in the present embodiment is now explained together with an exposure operation. In the present embodiment, in order to determine the tilt of the image plane and the curvature of the image plane of the projection optical system 3 and examine the parallelism between the best focus plane of the projection optical system 3 and the run plane of the wafer stage 7 (the leveling stage 6), a preliminary process shown in FIG. 3 is required.

Figure 3:
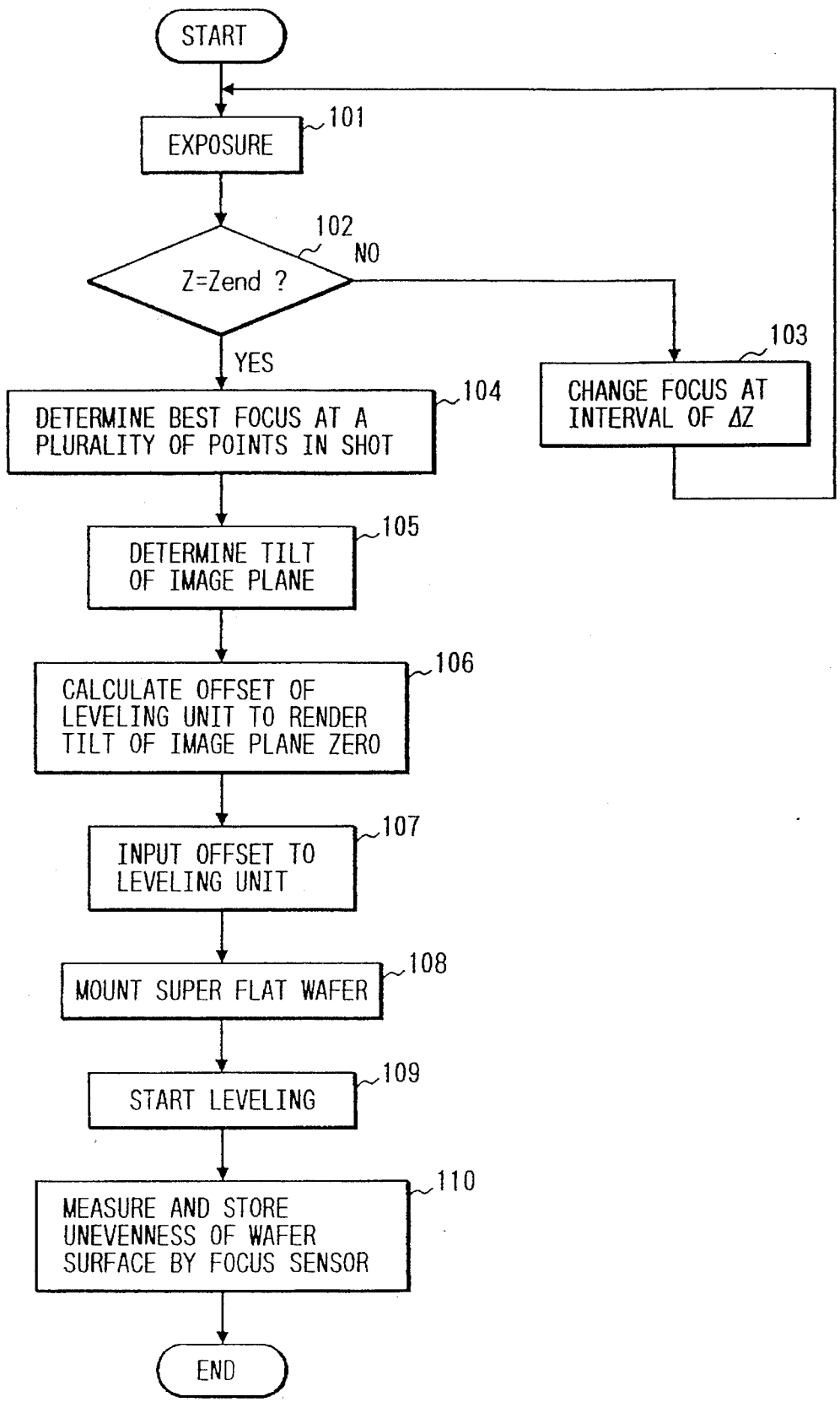
FIG. 3 shows a flow chart of a preliminary process of the leveling operation in the embodiment of the present invention.

In the preliminary process of FIG. 3, a test reticle having patterns of a predetermined shape (for example, a wedge pattern) formed at a predetermined plurality of positions is mounted on the reticle holder 2 as an initial step. Then, a wafer for test print having a high planarity and having photoresist applied thereon is mounted on the wafer holder 5. Then, the wafer stage (Z stage) 7 is driven along the optical axis (Z axis) of the projection optical system 3 to arrange the surface of the wafer substantially below (away from the projection optical system 3) the best focus plane of the projection optical system 3.

Then, a first exposure is conducted in a step 101 to transfer the pattern of the test reticle to one shot area on the wafer. In a step 102, whether the Z coordinate of the Z stage has reached an upper limit Z end or not is checked. If it has not reached, the process proceeds to a step 103 to drive (lift up) the Z stage by ΔZ along the optical axis of the projection optical system 3, and drive the wafer stage 7 (XY stage) to drive the next shot area on the wafer to the exposure position (the projection position of the reticle pattern by the projection optical system 3). Then, the process returns to the step 101 to conduct a second exposure. At this time, the Z-axis positioning of the Z stage is conducted in accordance with the detection signal from the AF system. The lift-up of the Z stage by ΔZ at a time means that the Z-axis distance between the projection optical system 3 and the surface of the wafer is reduced by ΔZ at a time.

The steps 101–103 are repeated until the Z coordinate of the Z stage reaches the upper limit, when the process proceeds to a step 104 to develop the wafer. Then, a plurality of resist images formed one for each shot area on the wafer are detected by visual observation or by using an alignment sensor of the exposure apparatus and a shot area or a Z coordinate having a best focused resist image for each of the plurality of reticle patterns is selected as a best focus position. As a result, the best focus position (and a depth of focus) at each of the plurality of points in the projection view field of the projection optical system 3 are detected. In a step 105, a plane defined by the plurality of best focus positions (Z coordinates), that is, a best focus plane of the projection optical system 3 is determined. If tilt of the image plane or curvature of the image plane is included, the plane determined in the above process includes the tilt and the curvature relative to a plane perpendicular to the optical axis AX of the projection optical system 3. The minimum square method may be used in determining the best focus plane, and if the curvature of the image plane is included in the projection optical system 3, the focusing plane thereof may be determined as an approximate plane. The detail of the above measurement method is disclosed in U.S. Pat. No. 4,908,656.

In the above process, the focusing plane of the projection optical system 3 is determined by the test print. For example, a reference member having a light emitting reference mark may be provided on the wafer holder 5 and an image of the reference mark may be focused to a lower surface (pattern plane) of the reticle through the projection optical system 3. Further, a reflection light from the pattern plane may be photo-electrically detected through the projection optical system 3 and the reference mark and the best focus position at the predetermined point in the projection view field of the projection optical system 3 may be determined based on the change in the level of the photo-electric signal when the reference member is moved along the Z axis. By repeating the above measurement at each of the plurality of points in the projection view field of the projection optical system 3, the tilt of the image plane and the curvature of the image plane of the projection optical system 3 can be determined as they can by the test print, and the best focus plane can be accurately determined. This measurement system is disclosed in U.S. patent application Ser. No. 888,828 filed on May 27, 1992 by the assignee of the present invention, now U.S. Pat. No. 5,204,535 issued Apr. 20, 1993, and only the reference member FM is shown in FIG. 2.

In a step 108, a super flat wafer having a very high planarity is mounted on the wafer holder 5. In a step 109, the leveling mechanism is activated, and in a step 110, the position of the surface of the super flat wafer is measured by using the AF system. Specifically, a deviation of the wafer surface from a reference plane (for example, the stage run plane) normal to the optical axis AX of the projection optical system 3 is determined for each of the plurality of measurement points in the predetermined area (corresponding to the shot area) on the wafer by using the AF system while the leveling mechanism is activated, that is, while the best focus plane of the projection optical system 3 and the surface of the super flat wafer are kept parallel. Then, an average plane is determined based on the plurality of deviations. The average plane may be calculated by the statical processing (minimum square method) or a search method. Since the present wafer is a super flat wafer, the plane determined in this process represents the leveling plane (best focus plane). The tilt of the leveling plane relative to the run plane of the XY stage is stored in a memory of the main control unit 29 as a reference that. This is the end of the preliminary process.

Figure 4:
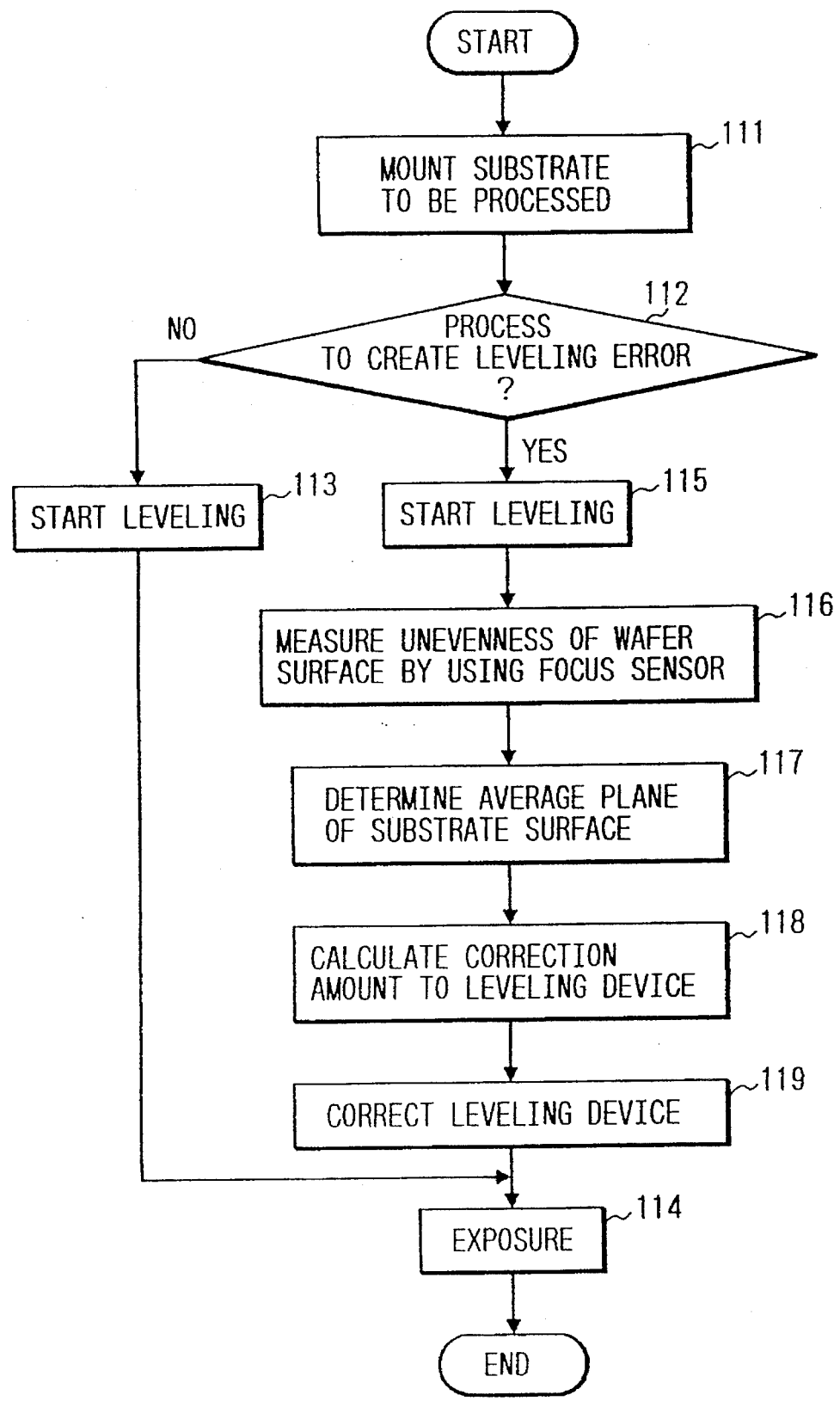
FIG. 4 shows a flow chart of a leveling operation in a first embodiment of the present invention.
Figure 12A:
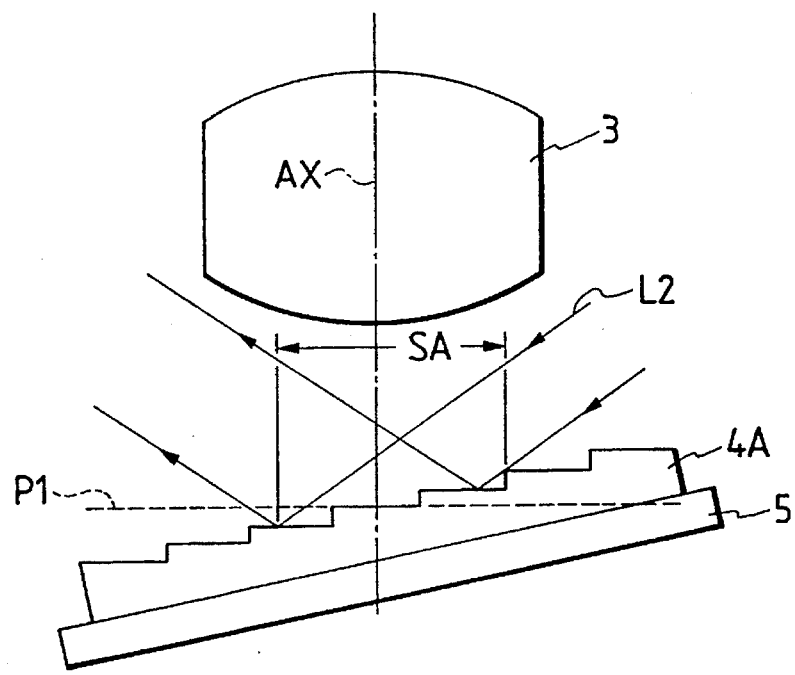
Figure 12B:
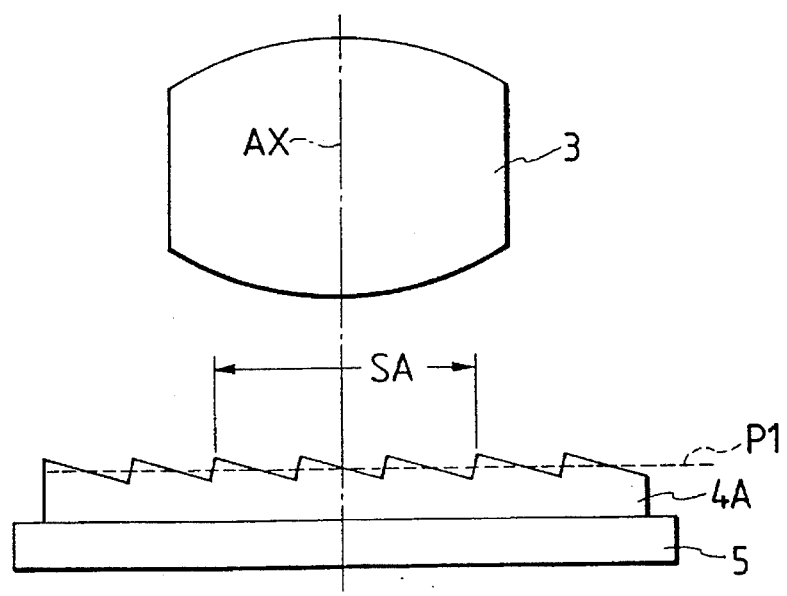

In a step 111 of FIG. 4, a process wafer 4 to be processed is mounted on the wafer holder 4. In a step 112, whether process may cause a leveling error or not is checked. The process which causes the leveling error means a process in which the surface of the wafer 4 detected by the AL system is inclined with respect to the actual surface of the wafer 4 (the average plane defined by the unevenness) (for example, a process to form the wafer 4A of FIG. 12A), and the existence of such process is experimentarily known. This information may be entered by the operator to the main control unit 29 through the keyboard 30. Alternatively, the above information may be registered in the bar code on the wafer or the wafer cassette and it may be read by the bar code reader 31 to enter the information to the main control unit 29. In the process which does not cause the leveling error, the process proceeds to a step 113 to activate the leveling mechanism, and the exposure is conducted in a step 114.

Figure 10:
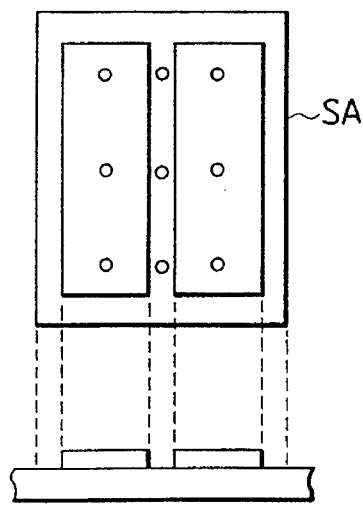
FIG. 10 shows a shot area on a wafer used in the embodiment of the present invention.
Figure 11A:
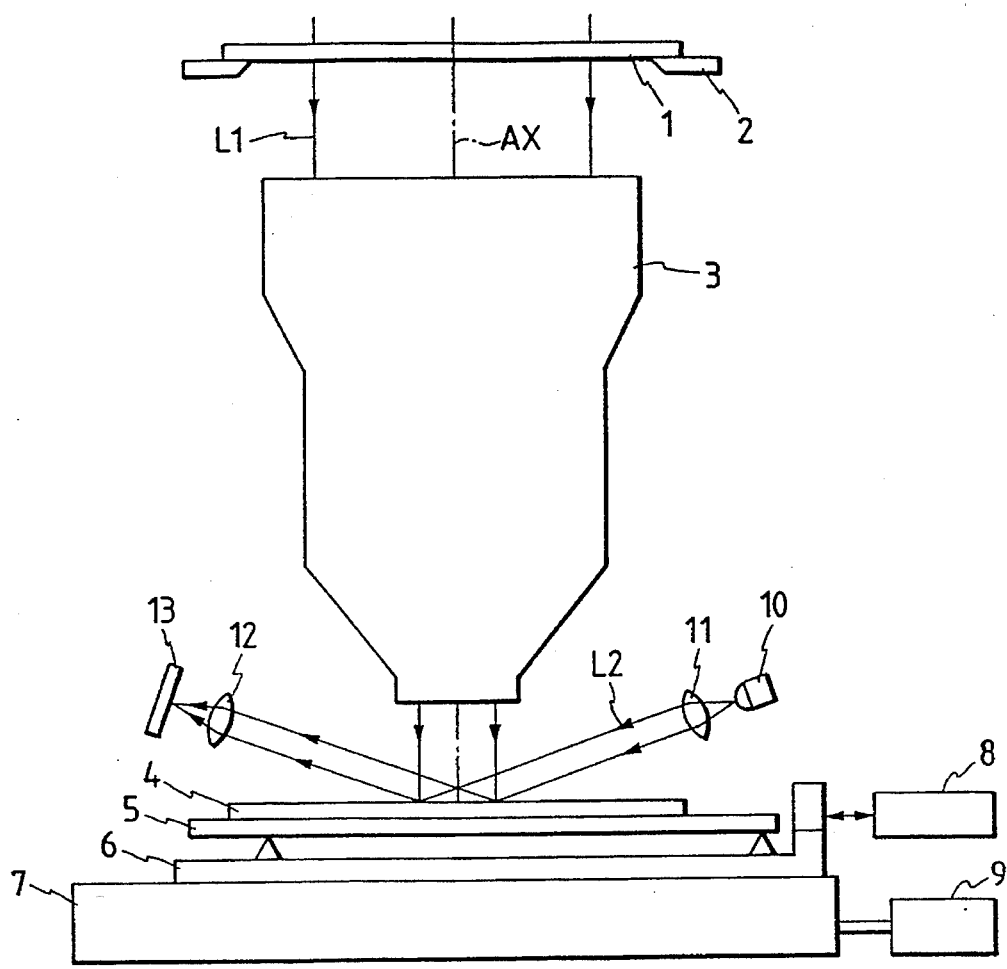
FIG. 11A shows a construction of a prior art projection exposure apparatus.
Figure 11B:
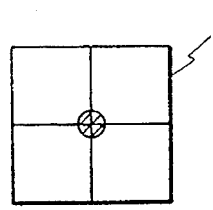
FIG. 11B shows a construction of a photo-sensor in FIG. 11A.
Figure 11C:
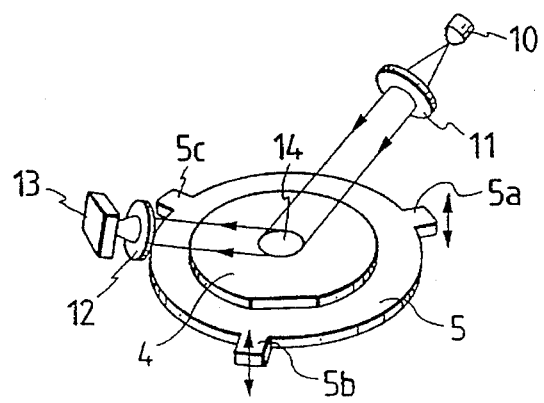
FIG. 11C shows a perspective view of an auto-leveling system in FIG. 11A, FIGS. 12A and 12B illustrate the leveling operation for a wafer having unevenness.

On the other hand, in the process which causes the leveling error, the process proceeds to a step 115 to activate the leveling mechanism. Then, in a step 116, the main control unit 29 drives the XY stage and measures the deviation from the best focus plane of the projection optical system 3 at each of the predetermined number of measurement points in one shot area on the process wafer 4 by using the AF system. This means the measurement of the unevenness of the surface of the wafer 4. In the shot area SA in which the unevenness of the surface of the wafer 4 exists as shown in FIG. 10, nine measurement points (marked by 0 in the drawing) are set. The main control unit 29 determines the average plane of the surface of the wafer 4 based on the plurality of deviations (step 117). However, the average plane thus determined includes a relative tilt between the run plane of the XY stage and the best focus plane of the projection optical system 3. In the present embodiment, the reference tilt of the run plane of the XY stage and the best focus plane of the projection optical system 3 has already been determined in the preliminary process of FIG. 3. Accordingly, in a step 118, the relative tilt between the average plane of the wafer 4 determined in the step 117. and the best focus plane of the projection optical system 3 is determined, and the reference tilt is subtracted from the determined tilt to calculate a residual tilt, that is, a tilt correction amount (a new offset) for the leveling mechanism.

Then, the correction amount is added to a target tilt amount for the leveling mechanism which is stored in an internal memory of the main control unit 29 and the main control unit 29 controls the tilt of the leveling stage 6 in accordance with the target tilt amount having the correction amount added thereto so that the surface of the wafer 4 (the average plane defined by the unevenness) on the leveling stage 6 is set parallel to the best focus plane of the projection optical system 3 (step 119). Then, the exposure is conducted in a step 114 so that the image of the pattern of the reticle 1 is sharply transferred to the surface of the wafer 4.

In the present embodiment, the tilt correction amount may be determined for each shot area on the wafer 4, or the tilt correction amount may be determined by only one to several shot areas and the leveling for all of the remaining shot areas may be conducted by using the determined tilt correction amounts (or average thereof). Alternatively, the tilt correction amount may be determined for each shot area for only the heading (first) wafer in one lot, and the leveling for the second and subsequent wafers may be conducted by using the tilt correction amount determined for the first wafer. Alternatively, the tilt correction amount may be determined by only one to several shot areas on the first wafer and the determined tilt correction amounts (or average thereof) may be used for the second-and subsequent wafers.

If the above correction for the leveling mechanism is conducted for all wafers in the predetermined lot processed by the process which may cause the leveling error, the throughput is lowered. Further, the correction for all of the shot areas on the one wafer selected for the correction of the leveling mechanism also lowers the throughput. Thus, a method for reducing a number of times of correction for the leveling mechanism is explained with reference to FIGS. 5 and 6.

Figure 5:
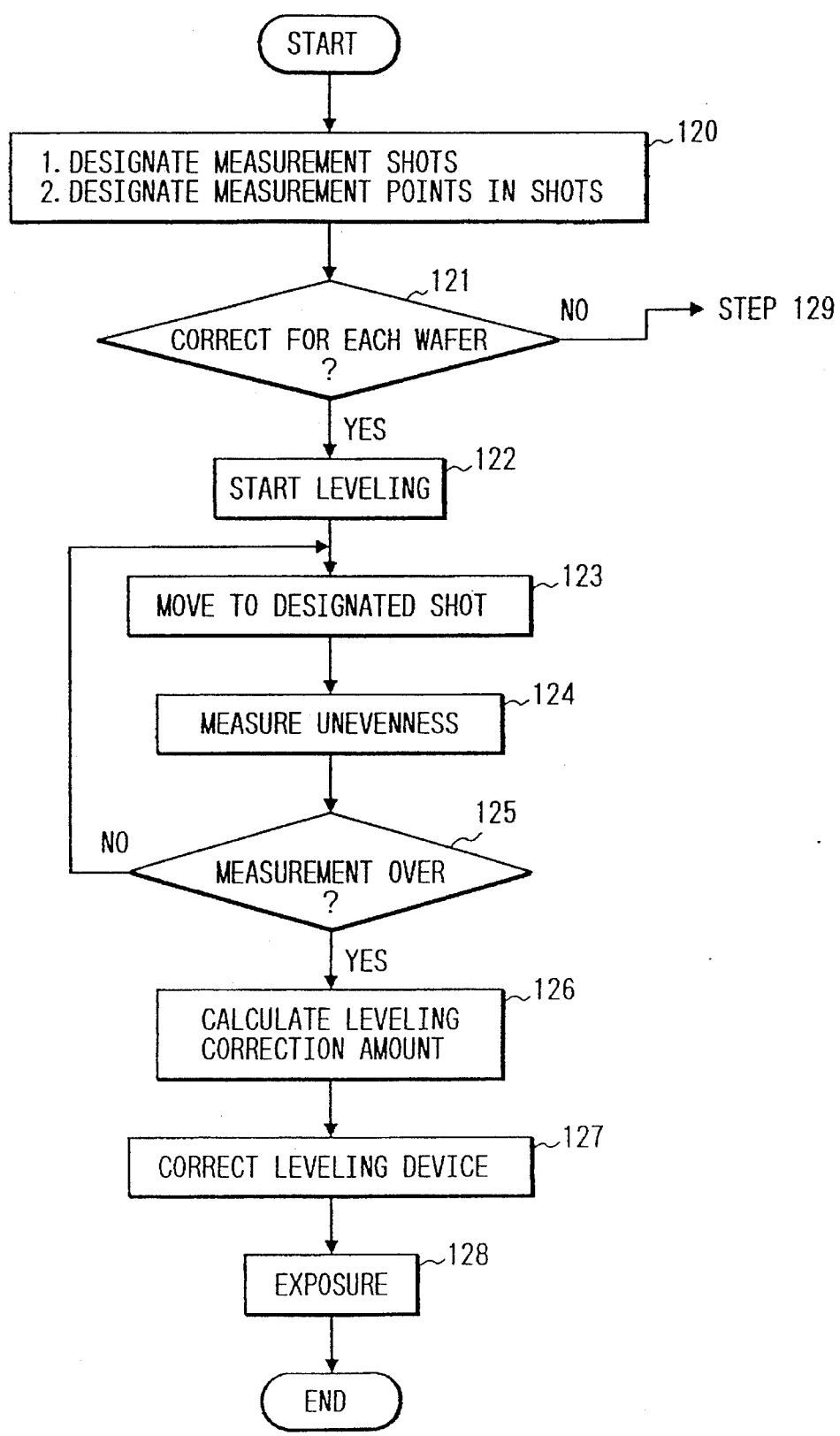
FIG. 5 shows a flow chart of a modification of the leveling operation of the first embodiment.

In a step 120 of FIG. 5, shot areas (measurement shots) for which the unevenness of the surface is to be measured by using the AF system are designated from all of the shot areas of the wafer for which the leveling mechanism is to be corrected. In one measurement shot, the positions and the number of the measurement points for which the deviation is to be detected by using the AF system are designated. Such designation may be made by the operator through the keyboard 30, or automatically made by the main control unit 29 in accordance with the input wafer unevenness information. The shot areas which are experimentarily known to have big unevenness may be designated as the measurement shots. A sufficient number of measurement points in the measurement shot to define the average plane are secured. Then, in a step 121, whether the correction for the leveling mechanism is to be made for each wafer of the lot to be processed or not is determined.

If the correction is to be made for each wafer, the process proceeds to a step 122 to activate the leveling mechanism and drive the measurement shot designated in the step 120 to the underneath of the projection optical system 3 (step 123). Then, the unevenness of the surface of the measurement shot, that is, the deviations δ at the respective measurement points are measured by using the AF system (step 124). The steps 123–125 are repeated until the measurement is completed for all of the measurement shots, and in a step 126, the correction amount of the target tilt amount for the leveling mechanism is calculated. The leveling mechanism is activated with the corrected tilt amount (step 127) and the exposure is made to all shots (step 128).

Figure 6:
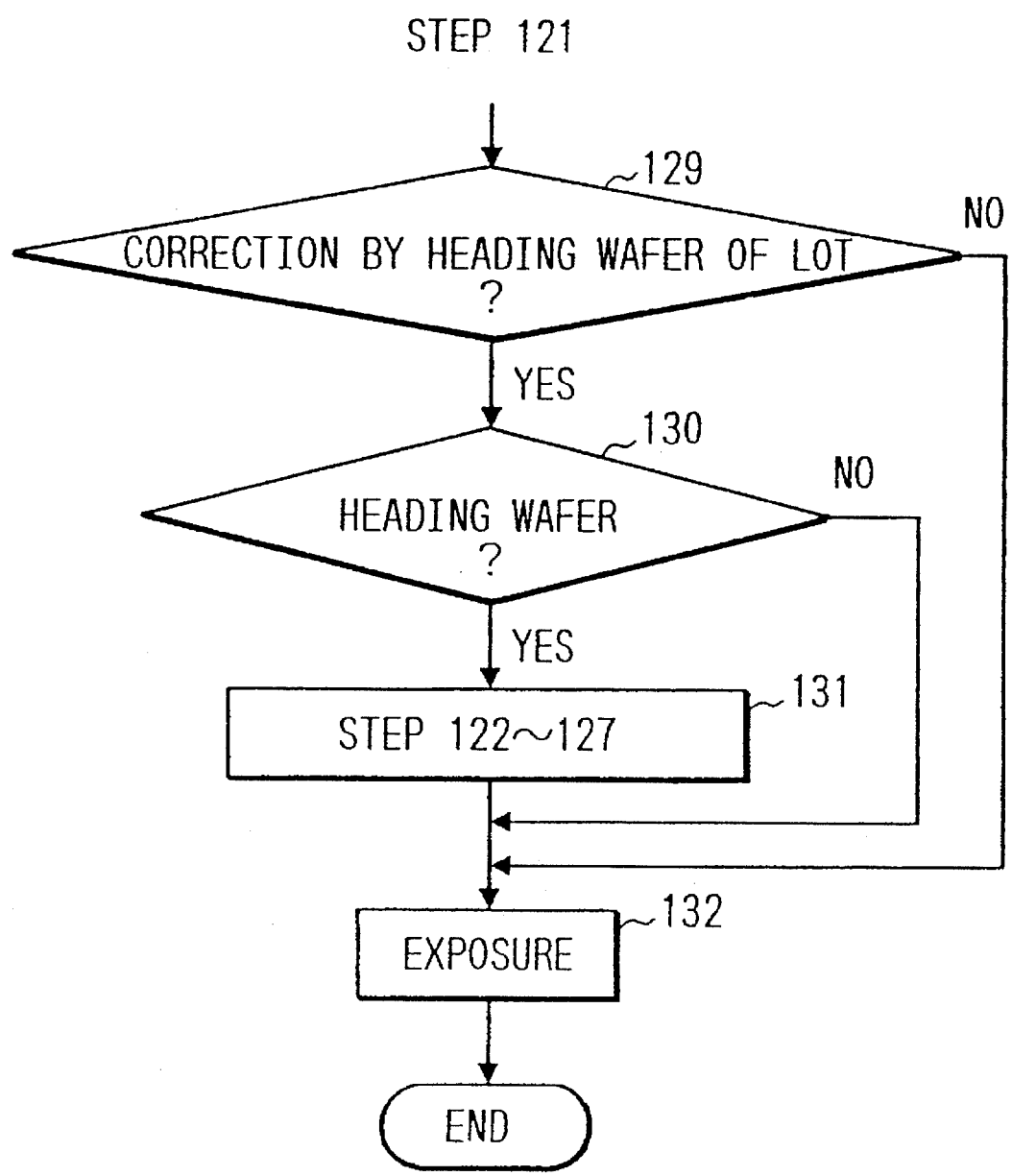
FIG. 6 shows a flow chart of a modification of the leveling operation of the first embodiment.
Figure 7:
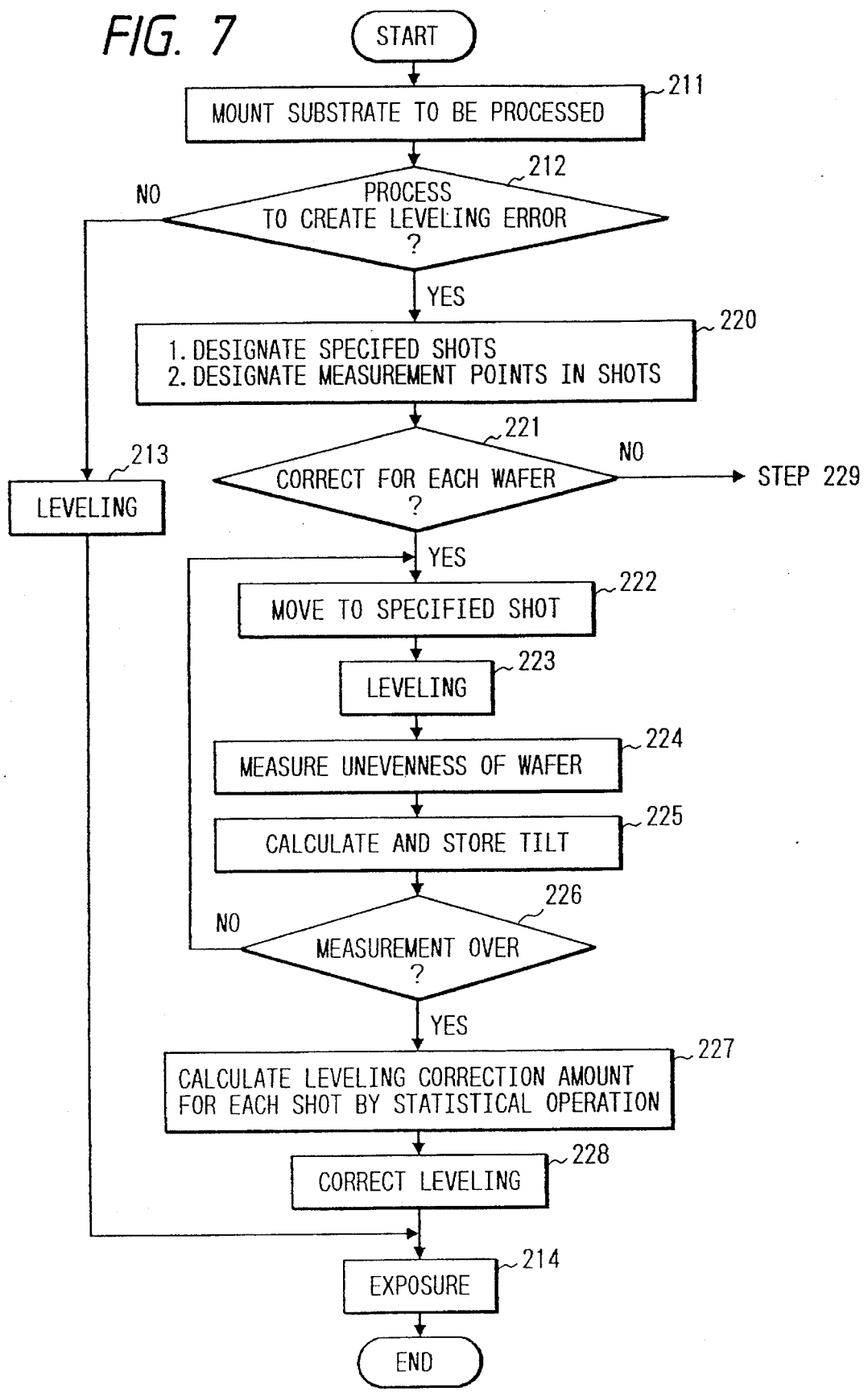
FIG. 7 shows a flow chart of a leveling operation in a second embodiment of the present invention.

If the correction is not to be made for each wafer in the step 121, the process proceeds to a step 129 of FIG. 6 to determine whether the correction for the leveling mechanism is to be made for the heading wafer of the lot or not. If the correction is to be made for the heading wafer, the process proceeds to a step 131 from a step 130 for the heading wafer. In the step 131, the same process as the steps 122–127 of FIG. 5 is carried out to determine the correction amount of the target tilt amount for the leveling mechanism.

For the second and subsequent wafers, the process proceeds to a step 132 to the step 130 to conduct the exposure while the leveling mechanism is corrected in accordance with the correction amount determined for the first wafer. On the other hand, if the correction is not to be made for the heading wafer in the step 129, the process proceeds to the step 132 directly to conduct the exposure without correction of the leveling mechanism. Alternatively, the exposure may be made while making the correction for a predetermined number of wafers starting from the heading wafer, and for the subsequent wafers, the correction may be made in accordance with the average of the previous correction amounts.

Figure 8:
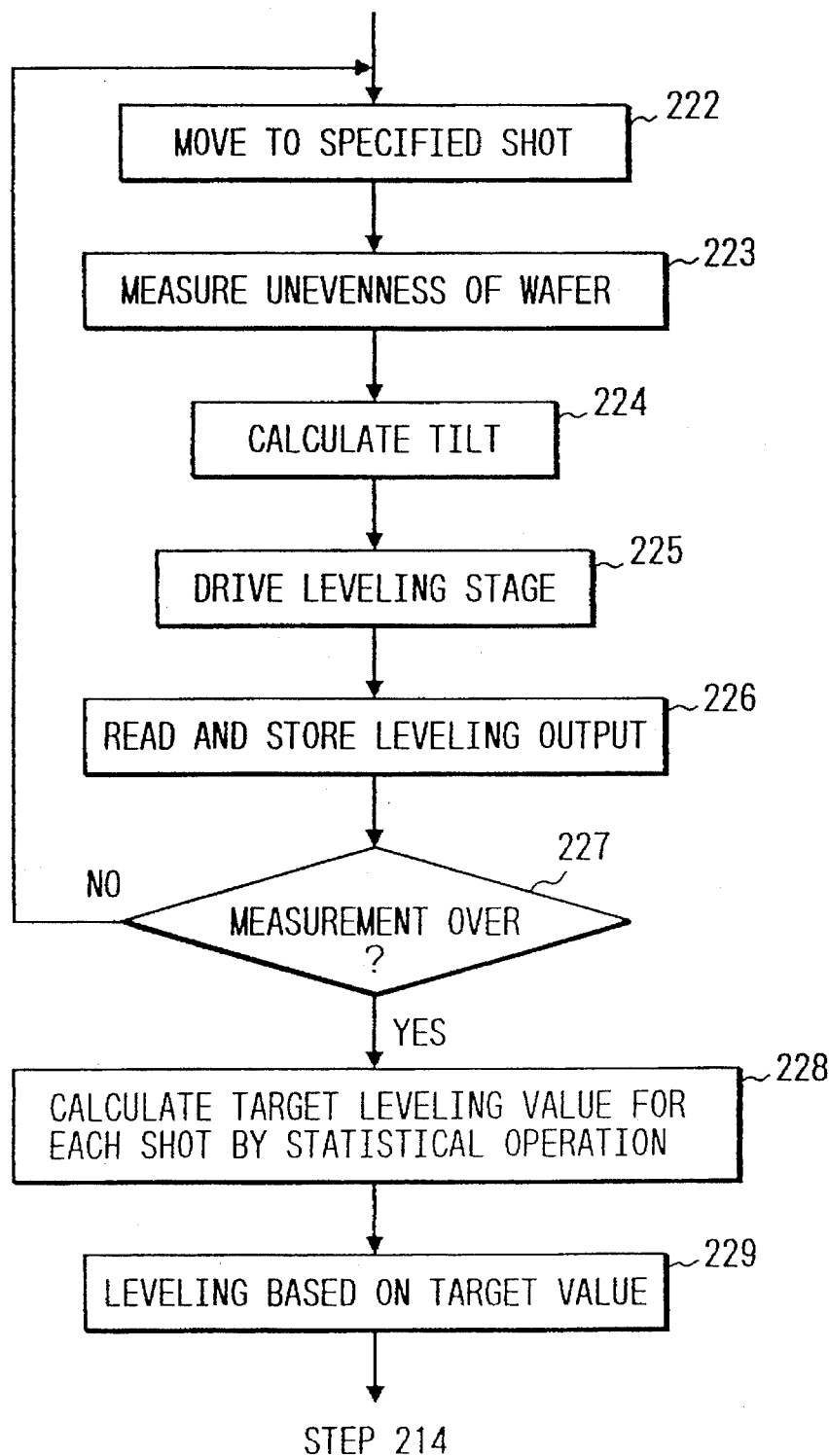
FIG. 8 shows a flow chart of a modification of the leveling operation of the second embodiment.
Figure 9:
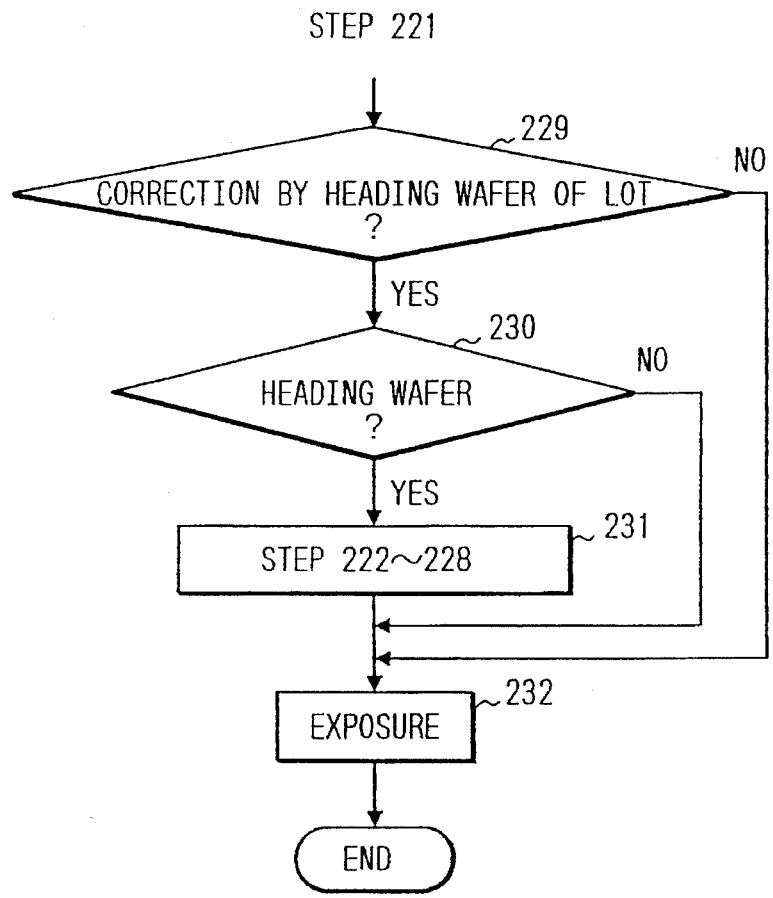
FIG. 9 shows a flow chart of a modification of the leveling operation of the second embodiment.
Figure 13A:
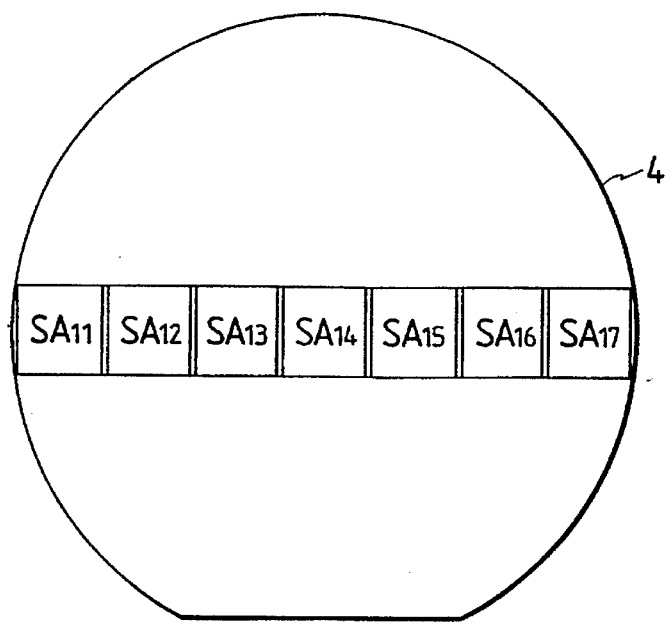
FIG. 13A shows one shot line on the wafer.
Figure 13B:
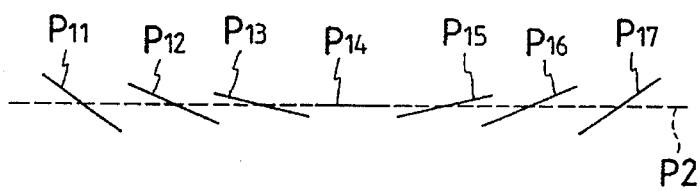
FIG. 13B shows a tilt for each shot area in FIG. 13A after the leveling operation.

Referring now to FIGS. 7 to 9, a second embodiment of the present invention is explained. A projection exposure apparatus used in the present embodiment is of the same construction as that of FIG. 2 and a preliminary process (FIG. 3) is totally identical to that of the first embodiment, and the explanation thereof is omitted here. The present embodiment is effective when the tilt of the surface (average surface) varies from shot area to shot area on the wafer. As an example, seven shot areas $SA_{11}$–$SA_{17}$ on a wafer 4 shown in FIG. 13A have their average planes $P_{11}$–$P_{17}$ inclined with respect to a run plane P2 (or a best focus plane of the projection optical system 3) of the XY stage as shown in FIG. 13B and the amounts of tilt (and directions of tilt) are different from each other. The present embodiment is effective to the wafer of FIG. 13A.

In a step 211 of FIG. 7, a wafer 4 to be processed is mounted on a wafer holder 5. In a step 212, whether the process is one which creates a leveling error or not is determined. If it is not, the process proceeds to a step 213 to activate a leveling mechanism, and in a step 214, the pattern exposure is conducted while leveling is made for each shot area.

Figure 14:
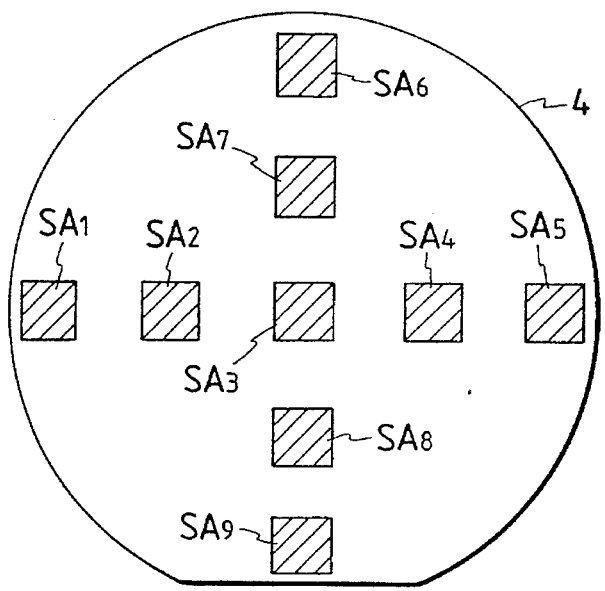
FIG. 14 shows an arrangement of specified shot areas selected from a plurality of shot areas on the wafer in the second embodiment of the present invention, FIG. 15 schematically shows an example of shot map data determined for a wafer outline.

On the other hand, if the process is one which creates the leveling error, the process proceeds to a step 220 to select specified shot areas and designate measurement points (positions and number) by the AL system in the specified shot area. At least three of the shot areas on the wafer 4 are selected as the specified shot area. The arrangement (positions and number) of the specified shot areas on the wafer 4 may be determined to enable the detection of a change in the residual tilt (offset) between the surface of the wafer and the focus plane in the wafer. In the present embodiment, nine shot areas $SA_1$–$SA_9$ are selected as shown in FIG. 14.

When the specified shot areas are to be selected, it is necessary to select them such that all specified shot areas are not aligned on a straight line. The number of measurement points in the specified shot area is at least three. Again, in case of three measurement points, those three points should be designated such that they are not aligned on a straight line. The positions of the measurement points in the specified shot area are those which well represent an average plane of the surface, for example, four corner points of the specified shot area. Information on a step structure (unevenness) in the shot area is inputted to a main control unit 29. Otherwise, an operator may enter such information to the main control unit 29 through an input device (a keyboard) and the positions of the measurement points may be set in accordance with the step structure.

In a step 221, whether the processing is to be done for each wafer or the result of measurement for a heading wafer of a lot is to be used for the second and subsequent wafers is selected. Where the measurement is to be made only for the heading wafer of the lot, the process proceeds to a step 229, and where the processing is to be made for each wafer, the process proceeds to a step 222. In the step 222, one of the nine specified shot areas in FIG. 14, for example, the specified shot area $SA_1$ is moved beneath the projection optical system 3 (the exposure position). In a step 223, the leveling mechanism is activated, that is, the tilt of the surface of the shot area $SA_1$ is detected by using the AL system and the leveling stage 6 is servo-controlled such that the surface of the shot area $SA_1$ is kept parallel to the focus plane of the projection optical system 3.

Then, in a step 224, the main control unit 29 measures a deviation of each of the designated points (measurement points) in the specified shot area from the run plane of the stage by using the AF system while the XY stage is driven. The main control unit 29 further calculates an average plane of the specified shot area in accordance with the deviations, determines a residual tilt of the surface (average plane) of the specified shot area relative to the best focus plane of the projection optical system 3, and stores the residual tilt as well as the position information (coordinates) of the specified shot area in a memory of the main control unit 29 (step 225). In a step 226, whether the above measurement has been done for all of the specified shot areas or not is determined. In the present example, since the measurement for only the specified shot area $SA_1$ is over, the process returns to a step 222 to calculate an average plane of the next specified shot area $SA_2$ in the same manner. Steps 222–226 are then repeatedly executed, and when the measurement for all of the specified shot areas is over, the process proceeds to a step 227. The average plane (residual tilt) calculated for each specified shot area may be decomposed to X and Y components, and the tilt may be stored by decomposing it to an X-axis tilt (X component) and a Y-axis tilt (Y component).

In step 227, interpolation is made by extracting a linear component by a stational operation by using the X and Y positions (coordinates) and the residual tilt of each of the specified shot areas, and the residual tilt is calculated for each of the shot areas on the wafer 4. Specifically, coefficients of a prepared model function are determined by the minimum square method by using the X and Y coordinates of the nine specified shot areas and the X and Y components of the residual tilts. An example of the model function may be the following formula (1) (matrix formula):

$$\begin{bmatrix} \theta_x \\ \theta_y \end{bmatrix} = \begin{bmatrix} a & b \\ d & e \end{bmatrix} \begin{bmatrix} x \\ y \end{bmatrix} + \begin{bmatrix} c \\ f \end{bmatrix} \quad (1)$$

where $\theta_x$ ms an X component of the residual tilt in one shot area on the wafer 4, and $\theta_y$ is a Y component.

The coordinates (x, y) of the specified shot area and the X and Y components ($\theta_x$, $\theta_y$) of the residual tilt are placed in the above formula and parameters a–f are determined by the minimum square method. The main control unit 29 determines the six parameters a–f and then calculates the residual tilts of all of the shot areas on the wafer 4. The residual tilt ($\theta_x$, $\theta_y$) of each shot area determined by the formula (1) represents a deviation (difference of tilt) of the surface (average plane) of the shot area relative to the best focus plane when the leveling stage 6 is driven in accordance with the detection signal from the AL system. Accordingly, the main control unit 29 adds the residual tilt ($\theta_x$, $\theta_y$) of each shot area, as the offset (leveling correction amount), to the tilt stored therein to set a target tilt of each shot area.

Then, the main control unit 29 controls the tilt of the leveling stage 6 in accordance with the target tilt for each shot area to set the surface of each of the shot areas on the wafer 4 parallel to the focus plane of the projection optical system 3 (step 228). As a result, in a step 214, the image of the pattern of the reticle 1 is sharply transferred to the surface of the shot area on the wafer 4 even if it includes the unevenness. In the above description, the tilt of the leveling stage 6 is controlled in accordance with the target tilt. Alternatively, in the step 227, only the leveling correction amount ($\theta_x$, $\theta_y$) may be calculated and stored for each shot area, and in the actual exposure operation, the tilt of the leveling stage 6 may be controlled such that the detection signal of the AL system is offset by the correction amount ($\theta_x$, $\theta_y$).

The detection signal of the AL system may be used for the statistical operation instead of the residual tilt of each specified shot area. This is explained with reference to FIG. 8. Steps 211 to 221 are identical to those of the second embodiment. In a step 222, one specified shot area is moved to the exposure position, and in a step 223, a deviation from the run plane of the wafer stage 7 is determined for each of the measurement points in the specified shot area by using the AF system. The tilt of the specified shot area is calculated based on those deviations in a step 224'.

In a step 225', the leveling stage 6 is driven in accordance with the calculated tilt to set the surface of the shot area parallel to the focus plane of the projection optical system 3. Then, the detection signal outputted by the AL system under the present state is read and stored (step 226'). In a step 227', whether the detection signals of all of the specified shot areas have been read or not is determined, and if they have been read, the process proceeds to a step 228'.

In the step 228', the same statistical operation as that conducted for the residual tilt in the second embodiment is conducted for the output of the AL system, for examples, the output voltages of the pitching and rolling directions. Thus, the target output of the AL system is set for each shot area on the wafer 4. In the actual exposure operation, the main control unit 29 servo-controls the tilt of the leveling stage 6 in accordance with the target output of the AL system set for the shot area to which the exposure is to be made (step 229'). As a result, the surface of the shot area is set parallel to the focus plane of the projection optical system 3 for each shot area.

If the leveling correction amount is calculated for all wafers in one lot which are to be processed by a process which is assumed to create a leveling error, the throughput is lowered. A method for reducing the number of times of measurement of the correction amount of the leveling mechanism is now explained with reference to FIG. 9.

When the leveling correction amount is not to be calculated for each wafer in the step 221 of FIG. 7, the process proceeds to a step 229 of FIG. 9 to determine whether the correction amount of the leveling mechanism is to be calculated by using the heading wafer of the lot or not. If the correction amount is to be calculated by using the heading wafer, the process proceeds from a step 230 to a step 231 to conduct the same steps as the steps 222–228 of FIG. 8 to determine the correction amount of the target tilt to the leveling mechanism. Then, in a step 232, the exposure is made to the heading wafer.

For the second and subsequent wafer, the process proceeds from the step 230 to a step 232 and the exposure is made while the leveling mechanism is corrected for each shot area in accordance with the correction amount determined for the heading wafer. On the other hand, if the correction is not made for the heading wafer in the step 229, the process proceeds to the step 232 directly to conduct the exposure to the wafer without calculating the correction amount of the leveling mechanism. Alternatively, the correction amount may be calculated for each of a predetermined number of wafers starting from the heading wafer and the exposure may be made while the correction is made for each shot area, and for the subsequent wafers, the correction may be made based on an average of the previous correction amounts.

Of the specified shot areas on the wafer, a specified shot area whose deviation from a stage run plane in each of the designated positions cannot be measured in the step 224 described above cannot be exactly calculated for its average plane. As a result, in the above step 227 (the statistic operation process), the data of that specific shot area is rejected and only the data of the remaining specific shot areas are used. In this case, a shot area adjacent to the rejected specified shot area may be designated as an alternative shot and the steps 222 to 226 may be conducted for the alternative shot to determine an average plane (tilt), and the resulting data may be used in the step 227.

In accordance with the present embodiment, even if the tilt of the average plane varies from shot area to shot area, the accurate leveling may be made for each shot area even if the wafer includes the unevenness, while minimizing the reduction of the throughput. Further, even if the best focus plane of the projection optical system inclines (including curvature in an image plane), the surface of the wafer can be set accurately parallel to the best focus plane.

Figure 15:
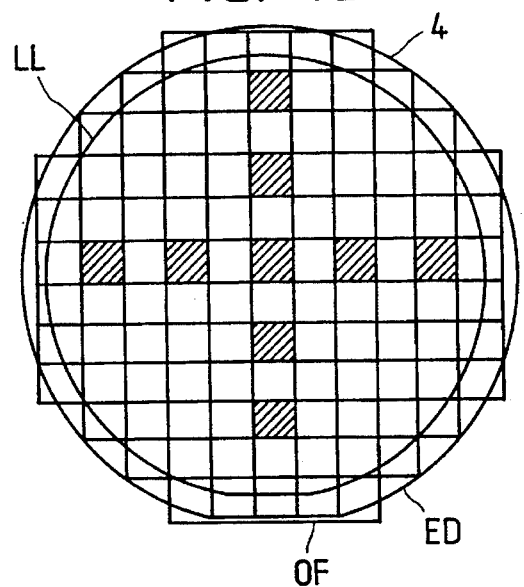

In the second embodiment, at least three shot areas are selected as the specified shot areas. The specified shot area is now explained in more detail with reference to FIGS. 15 and 16. In FIG. 15, nine hatched shot areas are the specified shot areas (corresponding to $SA_1$ to $SA_9$ in FIG. 10).

Normally, the main control unit 29 prepares optimum shot map data which conform to the outline of the wafer 4 based on the outer dimension of the wafer 4, the size of the shot area and the step pitch prior to the first print (the exposure of the first layer). The shot map data represents how the shot areas are to be arranged in the wafer based on the outline of the wafer 4 and it is automatically calculated and registered in the memory as the stepping coordinates of the wafer stage 7. The main control unit 29 calculates the coordinates of the center point of the wafer and a border line position of the inhibition band based on the determined shot map data and stores it in the memory.

FIG. 15 schematically shows an example of the shot map data determined to comply with the outline of the wafer. In FIG. 15, one rectangle represents a shot area. The inhibition band means a region which inhibit the detection of the tilt by the leveling optical system in a fixed width (1 to several mm) from the outer edge ED of the wafer 4 as shown in FIG. 15. The border line determined by the main control unit 29 is the line LL in FIG. 15 which is defined by a radius from the center of the wafer 4. For the linear notch (orifuller) OF, the inhibition band of the fixed width (the border line LL) is established along the orifuller OF. The inhibition band is usually provided because only a few good chips are acquired by the variation in the application of the resist, the variation in various processes or the break in the wafer edge ED. Accordingly, the width of the inhibition band may be generally fixed to a constant but the width of the inhibition band may be settable to permit light change in accordance with the chip size.

In the second print (the exposure of the second layer), the offset from the mount position of the wafer on the wafer holder 5 in the first print is determined based on the result of the wafer global alignment and the offset is incorporated as the correction value for the calculation of the center point of the wafer and the inhibition band border line in the fast print. As a result, the deviations in the X and Y directions of the shot map (the matrix in FIG. 15) and the wafer outline created in the second print are corrected and the status in the first print is always maintained.

In the step 220 of FIG. 7, the main control unit 29 (or an operator) selects at least three specified shot areas from a number of exposed shots (the shot areas to which the reticle pattern is actually exposed) on the wafer based on the shot map data and the border line LL. Namely, of the exposed shot areas in which the measurement areas (the area in which the specified positions measured for the deviations from the stage run plane by the AF system in the step 224) which are set in the exposed shots are present in the leveling area within the border line LL and which are not located on the outermost periphery of the wafer, at least three exposed shot areas which are not on a straight line are selected as the specified shot areas.

Figure 16:
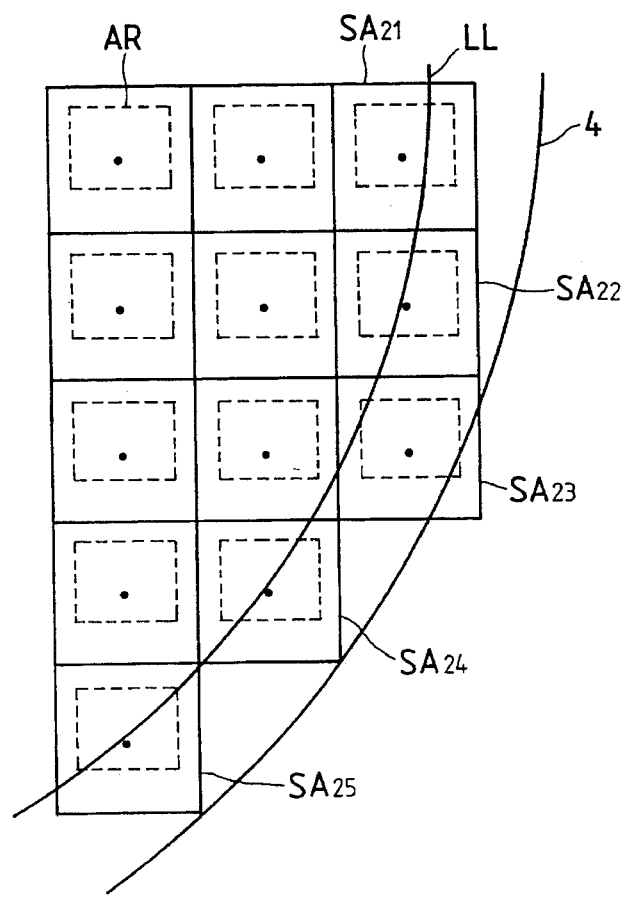
FIG. 16 shows a partial enlarged view of the wafer of FIG. 15.

The measurement area (the area which can designate a plurality of measurement positions in the AF system) is set in the area which contains at least a portion of the exposed shot area and it corresponds to the area in which the average plane is to be exactly aligned to the reference plane (the best focus plane of the projection optical system) in the exposed shot. The size and the position thereof are determined based on the step (unevenness) in the exposed shot and the size of the circuit pattern area. FIG. 16 shows a partial enlarged view of the wafer 4 shown in FIG. 15. An area AR shown by a broken line in the exposed shot represents the measurement area and a dot represents a center position of the exposed shot. In FIG. 16, five exposed areas $SA_{21}$ to $SA_{25}$ in which at least a portion of the measurement area AR is present externally of the border line LL (in the inhibition band) do not meet the above condition and they are eliminated from the subject for the selection in the selection of the specified shot area. Namely, in FIG. 16, seven remaining exposed shots excluding the exposed shots $SA_{21}$ to $SA_{25}$ are the subject of selection.

Figure 17:
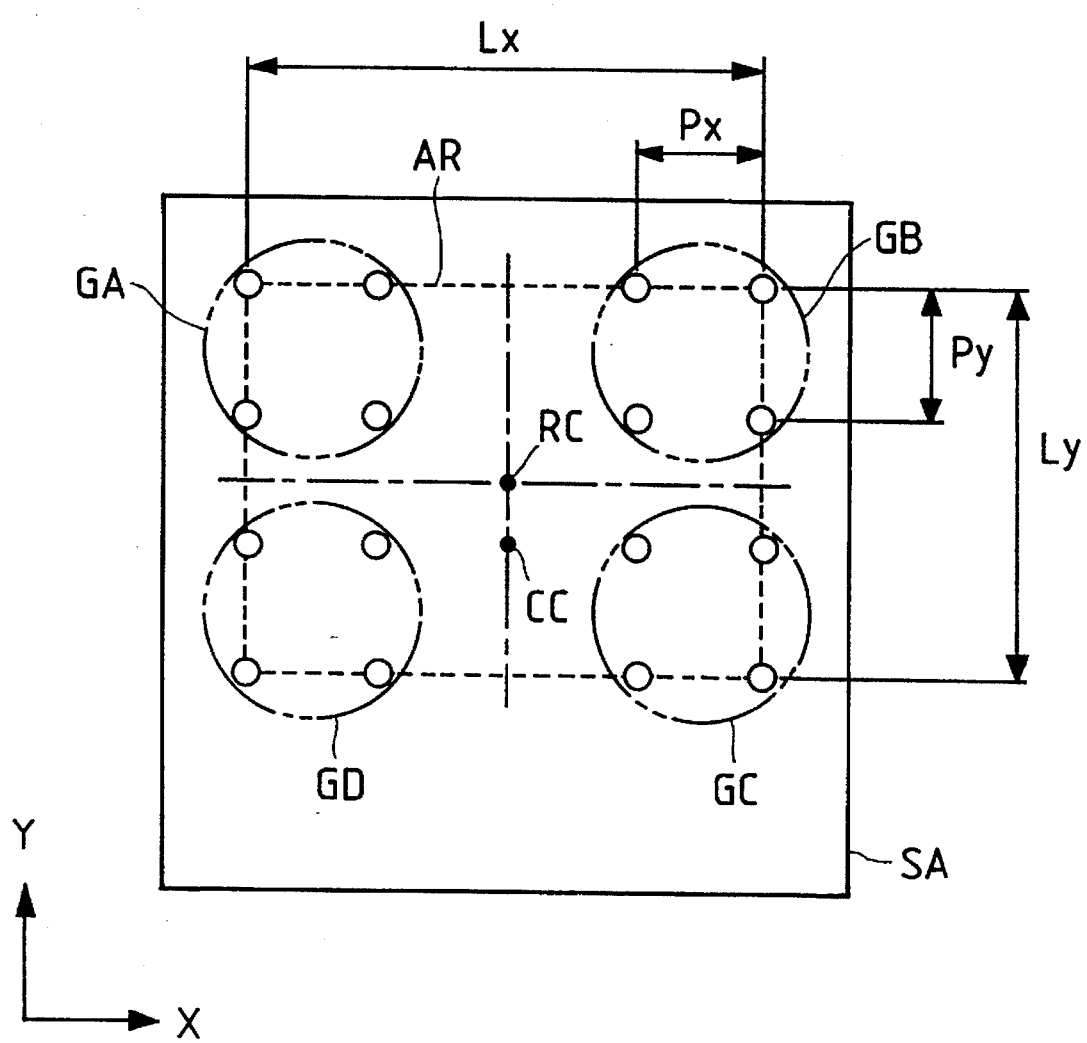
FIG. 17 shows examples of a measurement area and a measurement point set in one shot area on the wafer.

Referring to FIG. 17, the setting method of the measurement area in the exposed shot is briefly explained. FIG. 17 shows one exposed shot area SA on the wafer, a crosspoint RC of two chain lines represents the center position of the measurement area (broken line). In FIG. 17, the measurement area AR deviates from the center CC of the exposed shot SA by a predetermined distance in the Y direction and the size (the lengths of the sides) thereof is defined by $L_x$ and $L_y$. The main control unit 29 (or the operator) sets the deviations (offsets) $O_x$ and $O_y$ of the center RC relative to the center CC of the shot and the size (the lengths of the sides) $L_x$ and $L_y$ in accordance with the leveling area which is determined by the step in the exposed area and the size of the circuit pattern area to determine the size and the position of the measurement area AR in the exposed area SA.

In FIG. 17, 16 measurement points (dots) for the AF system are set in the measurement area AR. The 16 measurement points are divided into four groups (double-chain line circles) GA, GB, GC and GD each having 2×2=4 points, and the four groups GA to GD are set at the four corners of the measurement area AR. In FIG. 17, the main control unit 29 measures the deviation from the stage run plane at each of the 16 measurement points by using the AF system. Thereafter, the four deviations of each group are averaged (weighted averaging or minimum square approximation) to determine one deviation and an average plane of the specified shot area or the measurement area is calculated based on the four deviations (averages). The main control unit 29 (or the operator) sets the number (m×n) of measurement points in each group and the distances (pitches) $P_x$ and $P_y$ of the measurement points to determine the number of measurement points and the positions in the group in the measurement area AR. It is assumed here that four groups are set at the four corners of the measurement area AR, respectively. Alternatively, the set position of each group may be used as parameters as are the pitches $P_x$ and $P_y$.

The number of groups in the measurement area AR is not limited to four but it may be any number equal to or larger than three and the positions of the groups in the measurement area AR may be arbitrary. The number of measurement points in each group may be at least one and the numbers of measurement points and the positions thereof may differ between the groups. The position and the size of the measurement area AR or the number and the size of the groups and the measurement points therein may be separately set for each specified shot area or equal in all specified shot areas, and they may be automatically determined by the main control unit 29 in accordance with the type of the wafer (the step in the exposed shot or the size of the circuit pattern area). Theoretically, the entire measurement area AR may be set externally of the exposed shot but preferably it includes at least a portion of the exposed shot. Further, the measurement area AR may be set equally to or larger than the exposed shot (area). Where the measurement area AR is set larger than the exposed shot area, the measurement area AR is set across the specified shot area and at least one adjacent exposed shot. In this case, it is necessary to determine the size and the position of the measurement area AR such that it is set inside of the border line LL. In the second embodiment, the AL system irradiates the collimated light beam to the substantially entire surface of the exposed shot while the measurement area AR is set in the partial area in the exposed shot. Alternatively, the measurement area AR may be set equally to or larger than the illumination area on the wafer of the light beam from the AL system without regard to the size of the exposed shot.

The measurement area AR and the measurement points are determined in this manner so that the tilt of the specified shot area (measurement area AR) relative to the best focus plane of the projection optical system is precisely calculated.

In the second embodiment, the formula (1) is used as the model function in the step 227. Alternatively, the following formula (2) may be used.

$$\begin{bmatrix} \theta x \\ \theta y \end{bmatrix} = \begin{bmatrix} a & b \\ b & c \end{bmatrix} \begin{bmatrix} x \\ y \end{bmatrix} + \begin{bmatrix} c \\ f \end{bmatrix} \quad (2)$$

Namely, in the formula (2), the parameter d in the formula (1) is set to d=b. A reason for being capable of using the formula (2) is briefly explained below.

The leveling means to measure the tilt of the wafer surface. Assuming that the wafer surface is represented by z=W(x,y), the leveling means to measure $\partial W/D\partial x$ and $\partial W/\partial y$. The resulting wafer surface (that is, the wafer surface recognized by the AL system) is represented by z=W' (x,y), and the residual tilts θx and θy are represented by;

$$\theta x = \partial W/\partial x - \partial W'/\partial x = \partial (W-W')/\partial x$$

$$\theta y = \partial W/\partial y - \partial W'/\partial y = \partial (W-W')/\partial y$$

θx and θy represent a difference between the tilts of W and W' and it may be interpreted as a tilt of a curved plane W''=(W−W'). Since W and W' are "normal curved planes", the curved plane W'' is also "normal curved plane". The "normal curved plane" includes two planes or lines which intersect with a conventional onocoid but the curved plane W'' is not that kind but it means a curved plane of non-discontinuity. Accordingly, θx and θy may be determined from the deviations at a plurality of points in the shot area by using the AF system by $$\theta x = \partial W''/\partial x = ax+by+c$$

$$\theta y = \partial W''/\partial y = dx+ey+f$$

It is natural to consider that the above simultaneous differential equations actually have solutions W''=W−W. Then, θx=∂W''/∂x=ax+by+c is partially differentiated by y and θy=∂W''/∂y=dx+ey+f is partially differentiated by x to produce $$d = \partial^2 W''/\partial y \partial x = \partial^2 W''/\partial x \partial y = b.$$

In the apparatus described above, an enhanced global alignment (EGA) system disclosed in U.S. Pat. Nos. 4,780,617 or 4,833,621 is primarily used. In the EGA system, prior to the overlapping exposure onto one wafer, at least three shot areas formed on the wafer, for example, seven shot areas located on an outer periphery of the wafer are designated as sample shots. For each sample shot, coordinates of two sets of (X and Y-axis) alignment marks are measured by an alignment sensor (sample alignment). Then, error parameters relating to an arrangement characteristic of the shot areas on the wafer, that is, six parameters including offset (X and Y directions) of a center position of the wafer, expansion and contraction (X and Y directions) of the wafer, residual rotation in the wafer and orthogonality of the wafer stage (orthogonality of the shot arrangement) are determined by the statistical operation (minimum square method) based on the mark positions (measurements) and the design values. Based on the determined parameters, the designed coordinates are corrected for all of the shot areas on the wafer and the wafer stage is stepped in accordance with the corrected coordinates. The arrangement of the specified shot areas in the second embodiment on the wafer and the arrangement of the sample shots in the EGA may be identical or practically shared. The coordinates of the sample shots may be corrected by using the leveling correction amount of each specified shot area.

In the second embodiment, the leveling correction amounts are determined for the nine specified shot areas. Alternatively, unmeasurable shot areas or those shot areas whose measurements have extreme offsets may be rejected and only the remaining shot areas may be used. For the rejected shot areas, the previous target tilt is not used but the leveling correction amount detected by using the focusing detection optical system may be directly used. A shot area which is nearby the rejected shot area may be selected as an alternative shot and the measurement for the alternative shot may be used. When some of the tilts of the nine specified shot areas are not measurable by some reason and the correction amount cannot be calculated, or when the calculation of the correction amount is not attained or abnormal correction amount is attained by the abnormal value of the measured tilt, the correction amount calculated in the previous run (for example, the immediately previous wafer) may be used to correct the leveling of the shot areas on the wafer.

In the first and second embodiments, a multi-point measurement sensor may be used as the focusing detection optical system. In the multi-point measurement sensor, at least one elongated slit image is projected along a projection view field of the projection optical system, that is, a diagonal line of the shot area, an image refocused by a reflected light is split and sensed by a one-dimensional or two-dimensional image sensor to measure levels of a plurality of points in the exposure area at one time. Thus, the measurement time can be significantly shortened.

In the first and second embodiments, a super flat wafer is used. Alternatively, a reference member provided at a portion of the wafer holder 5 and having a highly planar reflection plane in the same plane as the wafer surface may be used. For example, a highly planar reflection plane may be formed on the reference member FM of FIG. 2.

In the first and second embodiments, the leveling to set the shot area surface (the average plane defined by the unevenness) parallelly to the best focus plane of the projection optical system 3 has been explained. Usually, in the projection exposure apparatus, the focusing to bring the best focus plane and the shot area surface (the average plane) coincident in the direction of the optical axis of the projection optical system 3 is effected in parallel to the leveling. In the focusing, a deviation δ between the surface of the shot area at a predetermined point and a reference plane (the best focus plane of the projection optical system) in the direction of the optical axis is detected by using the AF system and the wafer stage 7 is finely adjusted to bring the deviation δ to zero. In the first and second embodiments, the best focus plane and the shot area surface could be brought precisely coincident if the focusing is effected.

However, if there is unevenness in the shot area SA as shown in FIG. 10, it is difficult to bring the entire surface of the shot area SA coincident to the best focus plane even if the focusing is effected. In other words, the surface of the shot area SA may be partially off the depth of focus of the projection optical system 3. This is because the deviation δ detected by the AF system significantly changes depending on the position in the shot area SA. For example, when the AF system is used to detect the deviation δ in the recessed area in the shot area SA to conduct the focusing, the surface of the shot area SA may be off the depth of focus in the projected area.

Since the AF system of FIG. 2 projects a slit pattern image at the center (the optical axis position) of the projection view field of the projection optical system, the deviation δ at the center (the recessed area) of the shot area is detected in the focusing. Accordingly, when the focusing of the shot area SA of FIG. 10 is effected by using the AF system of FIG. 2, the surface of the shot area SA coincides with the best focus plane at the recessed area but the surface at the projected area significantly deviates from the best focus plane. The surface at the projected area may be off the depth of focus depending on the difference (gap) between the recessed area and the projected area in the shot area SA.

Figure 18A:
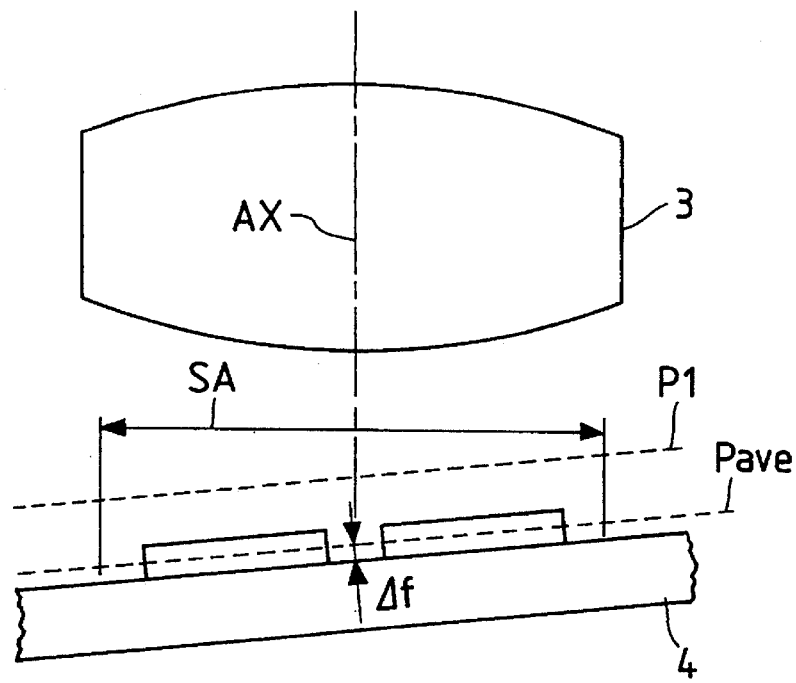
FIGS. 18A and 18B illustrate a focusing operation suitable to an embodiment of the present invention.

In the first and second embodiments, the average plane of the wafer (the shot area) is calculated based on the deviations at the measurement points in the shot area detected by the AF system and the gap between the surface at the center of the shot area and the average plane is determined. The reason for determining the gap between the calculated average plane and the shot area surface at the center of the shot is that in the focusing, the slit pattern image from the AF system is projected to the center of the projection view field of the projection optical system 3, that is, the center of the shot area. FIG. 18A shows that the best focus plane P3 of the projection optical system 3 and the surface (the average plane) Pave of the shot area SA (FIG. 10) are set in parallel by the leveling in the first and second embodiments. Accordingly, in FIG. 18A, the center of the shot is within the recessed area and[the distance (the focus offset) Δf between the average plane Pave of the shot area SA and the surface of the recessed area is determined. The optical or electrical offset is imparted to the AF system by the distance Δf and the wafer stage 7 is finely moved along the optical axis based on the output signal (S-curve signal) of the AF system. As a result, the average plane Pave of the shot area SA and the best focus plane P1 precisely coincide and the entire surface of the shot area SA is set within the depth of focus of the projection optical system 3.

Instead of imparting the optical or electrical offset corresponding to the distance Δf to the AF system, the distance Δf may be stored in the memory of the main control unit 29. The main control unit 29 servo-controls the wafer stage 7 such that the deviation δ detected by the AF system is equal to Δf. Where the deviation δ at the center of the shot has been previously determined (in other words, the center of the shot is designated as one of the measurement points in the shot area SA) in order to calculate the average plane Pave of the shot area SA, the distance Δf may be determined from the deviation δ and the previously calculated average plane Pave. On the other hand, where the deviation δ at the center of the shot has not been determined, the deviation δ at the center of the shot is detected by using the AF system, or the distance Δf may be determined by using the deviation δ at the measurement point which is at the same level as that of the center Of the shot, of the measurement points in the shot area SA. The distance Δf may be determined at any point in the shot area SA so long as it is the projection point of the slit pattern image of the AF system.

Where the focusing is effected in parallel to the leveling of the first embodiment, the distance Δf is determined in at least one shot area for which the average plane is calculated, of the shot areas on the wafer 4 and the focusing is effected by using the distance Δf. Where the distance Δf is determined for each of two or more shot areas, the distances Δf may be averaged and the focusing may be conducted for all shot areas on the wafer by using the average distance. The distances Δf may be weight-averaged or minimum square proximated, or a maximum and a minimum of the distances Δf may be averaged or weight-averaged to determine one distance. Where an average plane is to be calculated in each shot area on the wafer, the distance Δf determined from the average plane for each shot area may be used to conduct the focusing. The shot areas on the wafer may be divided into blocks and the distance Δf may be determined for each block or the distance Δf for each block may be determined by one of the methods described above. On the other hand, when the focusing is to be conducted in parallel to the leveling of the second embodiment, the distance Δf may be determined by using one of the methods described above. In the second embodiment, however, the distance Δf may be determined in only the shot area designated as the specified shot area.

Figure 18B:
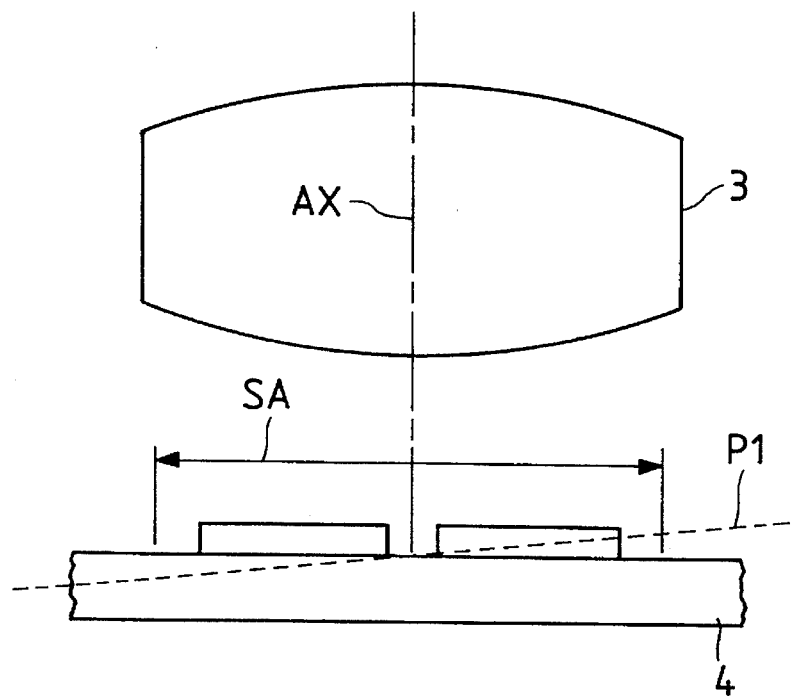

In the first and second embodiments, the average plane is determined bases on the deviations δ at the measurement points in the shot area detected by the AF system. While the deviations δ at the measurement points are detected by using the AF system, the wafer stage 7 should not be moved along the optical axis of the projection optical system and it should be locked to a predetermined level, although the level may be arbitrarily determined. Thus, the deviation δ at the center of the shot area SA is detected by using the AF system and the wafer stage 7 is finely moved along the optical axis such that the deviation δ becomes zero. As a result, as shown in FIG. 18B, the surface of the shot area at the center thereof exactly coincides with the best focus plane of the projection optical system 3. The wafer stage 7 may be moved in the X and Y directions while the above state is maintained to sequentially detect the deviations δ at the measurement points in the shot area SA, and the average plane of the shot area SA may be calculated based on the deviations δ. In this case, the deviation δ at the center of the shot, of the average plane corresponds to the focus offset Δf itself. Accordingly, the focus offset Δf at the center of the shot may be determined in the form of the deviation δ by calculating the average plane of the shot area by a predetermined operation (for example, the minimum square method) by using the deviation δ as the variable. The predetermined point in the shot area whose surface is to be brought coincide with the best focus plane prior to the detection of the deviations δ at the measurement points is not limited to the center of the shot but it may be any point in the area so long as the slit pattern image of the AF system is projected.

Figure 19:
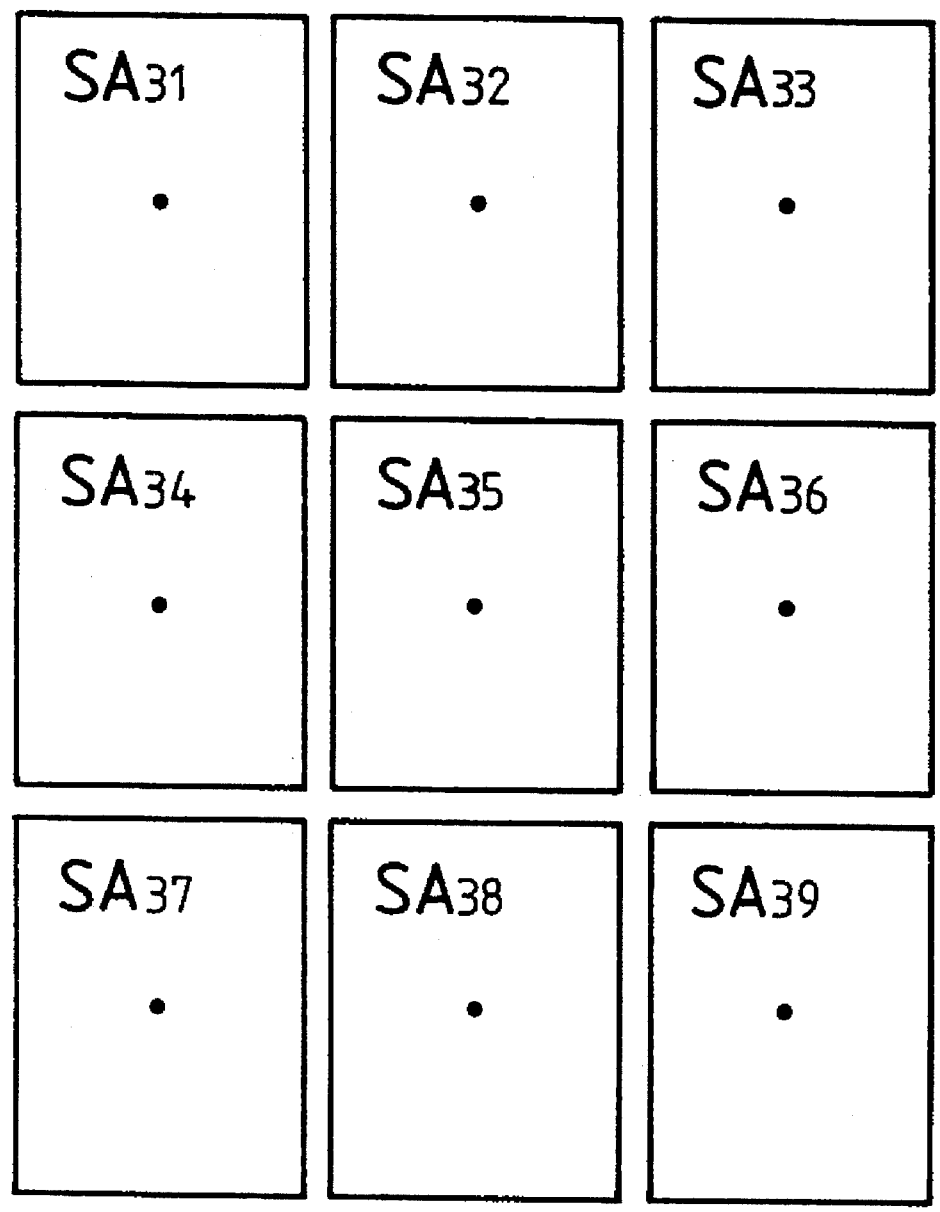
FIG. 19 illustrates a method for measuring inclination of a surface of the shot area relative a focus plane of a projection optical system.

In the first and second embodiments, the average plane is calculated based on the deviations δ at the measurement points in the shot area and the relative tilt of the average plane to the best focus plane of the projection optical system is determined. Further, the residual tilt which is the difference between the determined tilt and the reference tilt is determined as the tilt correction amount (offset) for the leveling mechanism. However, it is not always necessary to determine the tilt correction amount by using the average plane. As an example, when the tilt correction amount is to be determined for the shot area $SA_{35}$ of FIG. 19, four shot areas $SA_{31}$, $SA_{33}$, $SA_{37}$ and $SA_{39}$ of the eight shot areas $SA_{31}$ to $SA_{34}$ and $SA_{36}$ to $SA_{39}$ around the shot area $SA_{35}$ are selected. Then, the deviations δ at predetermined points, for example, the centers of the shot (dots) of five shot areas $SA_{35}$, $SA_{31}$, $SA_{33}$, $SA_{37}$ and $SA_{39}$ are detected by using the AF system. A relative tilt of the surface of the shot area $SA_{35}$ and the best focus plane of the projection optical system 3 is determined based on the five deviations $\delta$. Since the deviations $\delta$ at the centers of the five shot areas are detected, the tilt of the shot area $SA_{35}$ (wafer) to the best focus plane can be determined without being affected by the unevenness in the shot area. The residual tilt which is the difference between the determined tilt and the reference tilt is determined as the tilt correction amount to the leveling mechanism.

In this manner, the tilt correction amount of the shot area may be determined by using the deviations $\delta$ at a plurality of points externally of the shot area. The shot areas for which the deviations $\delta$ are to be detected may be any number no smaller than three without regard to the presence or absence of the shot area for which the tilt correction amount is to be determined, and the positions thereof are arbitrarily. From the standpoint of the calculation precision of the tilt correction amount and the throughput, however, four shot areas which are on the extended lines of two diagonal lines of the shot area for which the tilt correction amount is to be determined and closest to that shot area are to be selected. The deviations $\delta$ at the predetermined points in the five shot areas including the four selected shot areas and the shot area for which the tilt correction amount is to be determined are detected. The position in the shot area to detect the deviation $\delta$ may be anywhere in the shot area so long as it is same throughout the plurality of shot areas. When the tilt correction amount is to be determined for the shot area located on the outermost periphery of the wafer, the deviation $\delta$ may not be detected at the predetermined points in some of the four selected shot areas. In such a case, a shot area which is located inside of the outermost shot area may be regarded as the shot area for which the tilt correction amount is to be determined, and the tilt correction amount may be determined for that shot area.

What is claimed is:

1. A surface positioning apparatus comprising:

first detection means for projecting a light beam to a predetermined measurement point in a predetermined area on a substrate and sensing a light beam reflected by said substrate to produce a first signal representing a deviation of a surface of said predetermined area from a predetermined reference plane;

second detection means for obliquely projecting a light beam to a substantially entire surface of said predetermined area and sensing a light beam reflected by said substrate to produce a second signal representing a tilt of the surface of said predetermined area relative to said reference plane;

means for setting the surface of said predetermined area to a predetermined tilt position relative to said reference plane in accordance with said second signal;

means for calculating a tilt of the surface of said predetermined area relative to said reference plane in accordance with said first signal produced by said first detection means at each of a plurality of predetermined measurement points in said predetermined area set in said predetermined tilt position; and means for correcting the tilt of the surface of said predetermined area set by said setting means in accordance with the calculated tilt.

2. A surface positioning apparatus according to claim 1 wherein said correction means includes offset means for imparting an offset corresponding to the calculated tilt to at least one of said second detection means and said setting means.

3. A surface positioning apparatus according to claim 1 wherein said surface positioning apparatus is provided in a projection exposure apparatus for projecting and focusing an image of a pattern formed on a mask to a photo-sensitive substrate through a projection optical system, and said setting means tilts at least one of said focusing plane and said photo-sensitive substrate by using the focusing plane of said projection optical system as said reference plane.

4. A surface positioning apparatus according to claim 3 wherein said projection exposure apparatus includes a stage for holding said photo-sensitive substrate and tilting said photo-sensitive substrate with respect to a plane normal to an optical axis of said projection optical system, and said stage includes a reference member for measuring at least one of the tilt of the focusing plane of said projection optical system and the curvature in he mount position of said mask.

5. A surface positioning apparatus comprising:

first detection means for projecting a light beam to a predetermined measurement point in a shot area on a substrate and sensing a light beam reflected by said substrate to produce a first signal representing a deviation of a surface of said shot area from a predetermined reference plane;

second detection means for obliquely projecting a light beam to a substantially entire surface of said shot area and sensing a light beam reflected by said substrate to produce a second signal representing a tilt of the surface of said shot area relative to said reference plane;

means for setting the surface of said shot area to a predetermined tilt position relative to said reference plane in accordance with said second signal;

means for calculating a tilt of the surface of a specified shot area on the substrate relative to said reference plane in accordance with said first signal produced by said first detection means at each of a plurality of predetermined measurement points in said specified shot area set in said predetermined tilt position;

at least three of a plurality of shot areas arranged on said substrate being selected as said specified area; and means for statistically processing the tilts calculated for the at least three specified shot areas to calculate residual tilt at each of all shot areas on said substrate and correcting the tilts of the surfaces of said shot areas set by said setting means in accordance with the calculated residual tilt.

6. A surface positioning apparatus according to claim 5 wherein said correction means includes offset means for imparting an offset corresponding to the calculated residual tilt to at least one of said second detection means and said setting means.

7. A surface positioning apparatus according to claim 5 wherein said surface positioning apparatus is provided in an projection exposure apparatus for projecting and focusing an image of a pattern formed on a mask to a photo-sensitive substrate through a projection optical system, and said setting means tilts at least one of said focusing plane and said photo-sensitive substrate by using the focusing plane of said projection optical system as said reference plane.

8. A surface positioning apparatus according to claim 7 wherein said projection exposure apparatus includes a stage for holding said photo-sensitive substrate and tilting said photo-sensitive substrate with respect to a plane normal to an optical axis of said projection optical system, and said stage includes a reference member for measuring at least one of the tilt of the focusing plane of said projection optical system and the curvature in the mount position of said mask.

9. A surface positioning apparatus comprising:
  a first detector for projecting a light beam to a predetermined measurement point in a partial area on a wafer, sensing a light beam reflected by the wafer and producing a first signal representing a deviation of a surface of the partial area to a predetermined reference plane;
  a second detector for projecting a collimated light beam to a substantially entire surface of the partial area, sensing a light beam reflected by the wafer and producing a second signal representing a tilt of the partial area to the reference plane;
  a drive member for tilting the wafer in accordance with the second signal;
  said drive member setting the surface of the partial area in a predetermined tilt position to the reference plane;
  a computer for calculating the tilt of the surface of the partial area to the reference plane based on the first signal produced by said first detector at each of a plurality of measurement points in a specified partial area on the wafer set in the predetermined tilt position;
  at least three partial areas arranged on the wafer being selected as the specified partial area; and
  correction means for statistically processing the calculated tilt in each of the at least three specified partial areas to calculate a residual tilt in each of all partial areas on the wafer and correcting the tilt on the surface of the partial area established by said drive member based on the calculated residual tilts.

10. A surface positioning apparatus according to claim 9 wherein said computer calculates an average plane of the specified partial area based on the first signal and determines a distance between the surface of the specified partial area at the predetermined measurement point and the average plane, and
  said surface positioning apparatus further comprises a member for moving the wafer relative to the reference plane based on the first signal produced from said first detector and the determined distance in order to bring the surface of the partial area on the wafer coincident to the reference plane.

11. A method for setting a surface of a wafer to a reference plane for a partial area by using a first detector for projecting a light beam to a predetermined measurement point in the partial area on the wafer and producing a first signal representing a deviation of the surface of the partial area to the reference plane and a second detector for projecting a collimated light beam to a substantially entire surface of the partial area and producing a second signal representing a tilt of the surface of the partial area to the reference plane, comprising:
  a first step of setting the surface of a specified partial area on the wafer to a predetermined tilt position relative to the reference plane based on the second signal from said second detector;
  a second step of detecting the tilt of the surface of the specified partial area relative to the reference plane based on the first signal produced from said first detector at each of a plurality of measurement points in the specified partial area established in the predetermined tilt position;
  at least three partial areas on the wafer being selected as the specified partial area;
  a third step of statistically processing the calculated tilts of the at least three specified partial areas to calculate a residual tilt at each of the partial areas; and
  a fourth step of relatively tilting the wafer to the reference plane based on the second signal from said second detector and the calculated residual tilt for each partial area.

12. A method for positioning according to claim 11 wherein said second step including the sub-steps of:
  calculating an average plane of the specified partial area based on the first signal from said first detector; and
  determining the tilt of the average plane relative to the reference plane.

13. A method for positioning according to claim 12 wherein said second step includes a step of determining a distance between the surface in the specified partial area and the average plane,
  said method further comprising:
  a fifth step of relatively moving the wafer to the reference plane based on the first signal from said first detector and the determined distance.

14. A method for positioning according to claim 11 wherein said second step includes sub-steps of:
  relatively moving the wafer to the reference plane based on the first signal from said first detector such that a deviation of the surface of the specified partial area to the reference plane becomes zero at the predetermined measurement point;
  calculating an average plane of the specified partial area based on the first signal produced from said first detector at each of the measurement points other than the predetermined measurement point in the specified partial area; and
  determining the tilt of the average plane relative to the reference plane.

15. A method for positioning according to claim 14 further comprising:
  a fifth step of relatively moving the wafer to the reference plane for each partial area based on the distance between the surface in the specified partial area and the average plane at the predetermined measurement point and the first signal from said first detector.

* * * * *